(12) United States Patent
Kurikuma et al.

(10) Patent No.: US 10,361,355 B2
(45) Date of Patent: Jul. 23, 2019

(54) POWER GENERATION SYSTEM

(71) Applicant: Sumitomo Riko Company Limited, Aichi (JP)

(72) Inventors: Hajime Kurikuma, Aichi (JP); Koichi Hasegawa, Aichi (JP)

(73) Assignee: SUMITOMO RIKO COMPANY LIMITED, Aichi (JP)

(*) Notice: Subject to any disclaimer, the term of this patent is extended or adjusted under 35 U.S.C. 154(b) by 569 days.

(21) Appl. No.: 15/130,010

(22) Filed: Apr. 15, 2016

(65) Prior Publication Data
US 2016/0233406 A1    Aug. 11, 2016

Related U.S. Application Data

(63) Continuation of application No. PCT/JP2014/075920, filed on Sep. 29, 2014.

(30) Foreign Application Priority Data

Dec. 25, 2013  (JP) .................................. 2013-267164
Jan. 28, 2014  (JP) .................................. 2014-013105

(51) Int. Cl.
*H02N 2/18* (2006.01)
*H01L 41/04* (2006.01)
(Continued)

(52) U.S. Cl.
CPC .......... *H01L 41/042* (2013.01); *H01L 41/125* (2013.01); *H02M 7/06* (2013.01);
(Continued)

(58) Field of Classification Search
CPC .. H02M 7/06; H02M 7/10; H02M 2001/0077; H01L 41/042; H01L 41/125; H02N 2/18; H02N 2/181; H02N 2/186
See application file for complete search history.

(56) References Cited

U.S. PATENT DOCUMENTS 5,568,226 A * 10/1996 Kusano ................. G03G 15/80
                                              323/289
5,801,475 A    9/1998 Kimura
(Continued)

FOREIGN PATENT DOCUMENTS

JP          7-245970      9/1995
JP       2001-211606      8/2001
(Continued)

OTHER PUBLICATIONS

Office Action issued in Japan Counterpart Patent Appl. No. 2014-013105, dated Jul. 31, 2018, along with an English translation thereof.
(Continued)

*Primary Examiner* — J. San Martin
(74) *Attorney, Agent, or Firm* — Greenblum & Bernstein, P.L.C.

(57) ABSTRACT

A power generation system includes a first power generation apparatus and a second power generation apparatus outputting alternating voltages by an input of vibrations; a first voltage-doubling rectifier circuit not only rectifying the alternating voltages output by the first power generation apparatus to store electricity, but also outputting enhanced voltages to the load instrument; a second rectifier circuit rectifying the alternating voltages output by the second power generation apparatus, and connected in series to the first voltage-doubling rectifier circuit, thereby outputting rectified voltages to the load instrument; a constant-current circuit connected in series to the load instrument, thereby limiting currents flowing to the load instrument to a predetermined current or less.

16 Claims, 14 Drawing Sheets

(51) Int. Cl.
   *H02M 7/06* (2006.01)
   *H01L 41/12* (2006.01)
   *H02M 7/10* (2006.01)
   *H02M 1/00* (2006.01)

(52) U.S. Cl.
   CPC ................ *H02M 7/10* (2013.01); *H02N 2/18* (2013.01); *H02N 2/181* (2013.01); *H02N 2/186* (2013.01); *H02M 2001/0077* (2013.01)

(56) References Cited

U.S. PATENT DOCUMENTS

| | | | |
|---|---|---|---|
| 2011/0252880 | A1 | 10/2011 | Hama |
| 2012/0212101 | A1 | 8/2012 | Tabata et al. |
| 2013/0155631 | A1 | 6/2013 | Yamauchi et al. |
| 2014/0328101 | A1 | 11/2014 | Sameshima et al. |
| 2015/0035409 | A1 * | 2/2015 | Procopio ................ H02N 2/181 310/319 |

FOREIGN PATENT DOCUMENTS

| | | | | |
|---|---|---|---|---|
| JP | 2010-136535 | 6/2010 | | |
| JP | 2011-045225 | 3/2011 | | |
| JP | 4905820 | 3/2012 | | |
| JP | 2012-152009 | 8/2012 | | |
| JP | 2012-160620 | 8/2012 | | |
| JP | 2012-175712 | 9/2012 | | |
| JP | 2013-102639 | 5/2013 | | |
| JP | 2013-115913 | 6/2013 | | |
| JP | 2014-003771 | 1/2014 | | |
| JP | 2014023368 A * | 2/2014 | ........... | H01L 41/125 |
| WO | 2011/158473 | 12/2011 | | |
| WO | WO-2014017413 A1 * | 1/2014 | ........... | H01L 41/125 |

OTHER PUBLICATIONS

Office Action issued in Japan Counterpart Patent Appl. No. 2014-013105, dated Dec. 19, 2017 , along with an English translation thereof.

Notification of Reasons for Refusal, along with English-language translation thereof, issued in JP Appl. No. 2013-267164 dated Jul. 4, 2017.

International Search Report for PCT/2014/075920 dated Dec. 22, 2014.

* cited by examiner

POWER GENERATION SYSTEM

CROSS REFERENCE TO RELATED APPLICATIONS

The present application is a Continuation application of International Application No. PCT/JP2014/075920, filed on Sep. 29, 2014, which is incorporated herein by reference. The present invention is based on Japanese Patent Application No. 2013-267164, filed on Dec. 25, 2013, and Japanese Patent Application No. 2014-013105, filed on Jan. 28, 2014, the entire contents of which are incorporated herein by reference.

BACKGROUND OF THE INVENTION

1. Field of the Invention

The present invention relates to a power generation system using a power generation apparatus, which outputs alternating voltages by an input of vibrations, and outputting electric powers, which are generated by the power generation apparatus, to a load instrument.

2. Description of the Related Art

Japanese Patent Gazette No. 4905820 sets forth a magnetostrictive element as a power generation apparatus which outputs alternating voltages by an input of vibrations. A plurality of the power generation apparatuses generate electric powers by the vibrations of vibrating bodies with frequencies which differ respectively. That is, the timing, at which each of the power generation apparatuses generates electricity, differs.

Japanese Unexamined Patent Publication (KOKAI) Gazette No. 2012-160620, and Japanese Unexamined Patent Publication (KOKAI) Gazette No. 2012-152009 set forth voltage-doubling rectifier circuits, respectively, as a circuit rectifying alternating voltages. It is possible for the voltage-doubling rectifier circuits to make an output voltage higher to such an extent as much as twice by making it possible to store electricity in capacitors to which each of the bidirectional voltages of alternating voltages correspond. Japanese Unexamined Patent (KOKAI) Gazette No. 2001-211606 sets forth a full-wave rectifier circuit as a circuit which rectifies alternating voltages.

Japanese Unexamined Patent Publication (KOKAI) Gazette No. 2013-102639 sets forth storing electricity efficiently in an electricity storage portion by switching from a state where a plurality of power generation portions are connected in series, to another state where the multiple power generation portions are connected in parallel, or vice versa.

Incidentally, in order to enhance an output voltage, connecting a plurality of units, which include a power generation apparatus and a rectifier circuit, in series is thought of. In this instance, it was understood that, when one of the rectifier circuits constructing at least one of the multiple power-generation circuital units is a voltage-doubling rectifier circuit, electricity storage into a capacitor becomes less likely to be done, because of the following reasons.

For the purpose of explanation, let us consider a case where the voltage-doubling rectifier circuit of a first power-generation circuital unit and the rectifier circuit of a second power-generation circuital unit are connected in series. In this instance, in the first power-generation circuital unit, a first circuit, in which a first-direction current is flowed in a capacitor by an output of alternating voltages by a power generation apparatus, in the same manner as a case of being used conventionally as a stand-alone power generation circuit. By forming the first circuit, electricity has been stored in a capacitor of the voltage-doubling rectifier circuit.

However, by connecting a plurality of power-generation circuital units in series, a second circuit, in which a current flows in the capacitor in a direction opposite to the first direction, is formed, in addition to the first circuit. The second circuit is a circuit which intervenes between a load instrument and the rectifier circuit in the other power-generation circuital unit. When power-generation circuital units including a voltage-doubling rectifier circuit are connected in series, it has not been possible to securely store electric charges, which a power generation apparatus has output, in the capacitors, due to the formation of the first circuit and second circuit in which the directions of the flowing current are different from one another. Consequently, regardless of having connected the power-generation circuital units in series, an output voltage comes to decline adversely, and accordingly it has been difficult to enhance it.

Moreover, the present inventors investigated outputting a desired voltage to a load instrument for a long period of time, in a case where each of power generation apparatuses generates electricity in timing different from each other as set forth in Japanese Patent Gazette No. 4905820. In a case where a plurality of power generation apparatuses are switched to be connected in series, or to be connected in parallel, to store electricity in a common electricity storage portion as set forth in Japanese Unexamined Patent Publication (KOKAI) Gazette No. 2013-102639, electric powers generated by the multiple power generation apparatuses come to be consumed equally, because all of the power generation apparatus are connected to the common electricity storage portion. Therefore, with the construction, it is not possible to output a desired voltage for a sufficiently-long period of time.

An object of the present invention is to provide, while using a voltage-doubling rectifier circuit, a power generation system enabling electricity to be stored in the voltage-doubling rectifier circuit securely, when connecting a plurality of power-generation circuital units in series.

SUMMARY OF THE INVENTION

A power generation system directed to the present invention is a power generation system outputting generated electric powers to a load instrument, and comprises:

a first power generation apparatus and a second power generation apparatus outputting alternating voltages by an input of vibrations;

a first voltage-doubling rectifier circuit not only rectifying the alternating voltages output by the first power generation apparatus to store electricity, but also outputting enhanced voltages to the load instrument;

a second rectifier circuit rectifying the alternating voltages output by the second power generation apparatus, and connected in series to the first voltage-doubling rectifier circuit, thereby outputting rectified voltages to the load instrument;

a constant-current circuit connected in series to the load instrument, thereby limiting currents flowing to the load instrument to a predetermined current or less.

Since the first voltage-doubling rectifier circuit and the second rectifier circuit are connected in series, a first circuit in which the load instrument does not intervene, and a second circuit in which the load instrument intervenes are formed as circuits passing through a capacitor in the first voltage-doubling rectifier circuit. Between the first circuit and the second circuit, the directions of currents flowing in the capacitor in the first voltage-doubling rectifier circuit are different from one another. Consequently, even when electricity storage has been made by the first circuit, electric discharge comes to be made by the second circuit.

However, in accordance with the present means, the constant-current circuit limits currents flowing in the load instrument. That is, currents flowing to the second circuit are limited. Consequently, when currents output by the first power generation apparatus or the second power generation apparatus are sufficiently greater than a predetermined value, currents flowing in the first circuit in which the load instrument does not intervene become greater than currents flowing in the second circuit in which the load instrument intervenes. By thus limiting the currents flowing to the load instrument, it becomes feasible to store electricity in a capacitor in the first voltage-doubling rectifier circuit securely.

DESCRIPTION OF THE EMBODIMENTS

First Embodiment (Structure of Power Generation Apparatuses)

Figure 2:
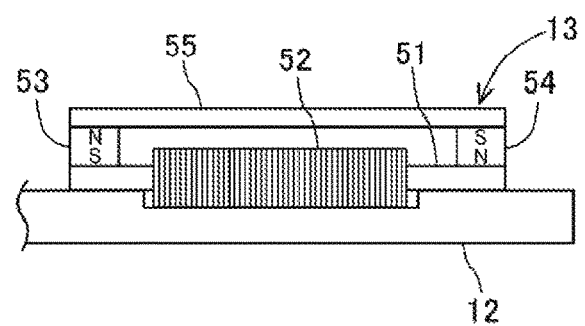
FIG. 2 is a diagram illustrating a construction of the first power generation apparatus which is shown in FIG. 1.
Figure 3:
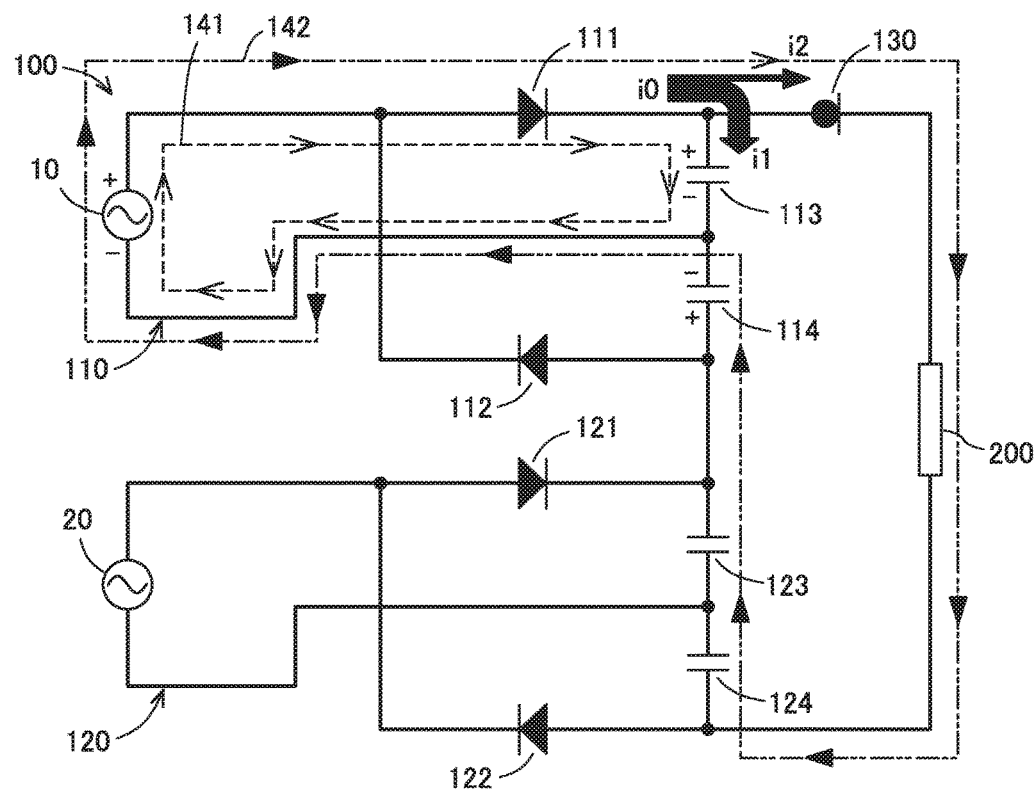
FIG. 3 illustrates a circuit construction of the power generation system in First Embodiment, wherein, when the upper side of the diagram of the first power generation apparatus makes a positive electrode, the first circuit is specified with the dashed lines and the second circuit is specified with the chain double-dashed lines.

A power generation system 100 (shown in FIG. 3) according to First Embodiment outputs generated electric powers to a load instrument (shown in FIG. 3). Regarding a first power generation apparatus 10 and a second power generation apparatus 20, which construct the power generation system 100, explanations will be made with reference to FIG. 1 and FIG. 2. The first power generation apparatus 10 and second power generation apparatus 20 output alternating voltages by an input of vibrations.

Figure 1:
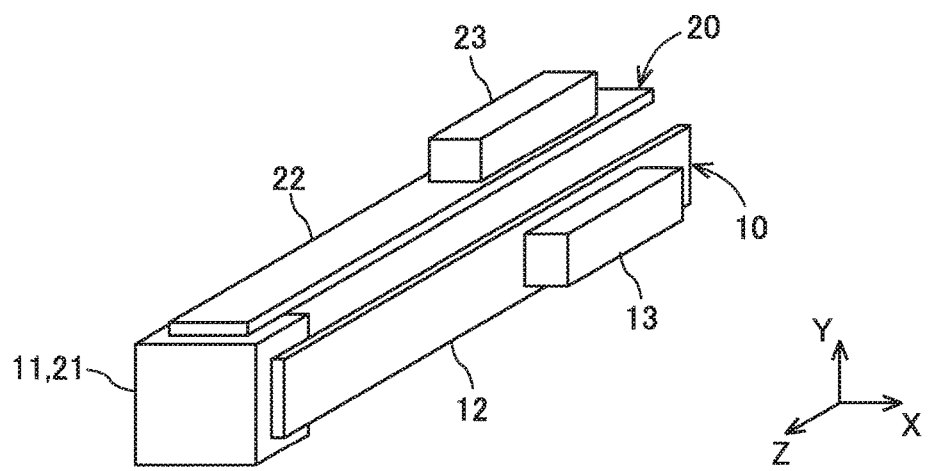
FIG. 1 is a diagram illustrating first and second power generation apparatuses which construct a power generation system in First Embodiment.

As illustrated in FIG. 1, the first power generation apparatus 10 comprises a fixing body 11, an X-direction vibrating body 12 fixed to the fixing body 11, and an X-direction power-generating body 13 installed to the X-direction vibrating body 12. The second power generation apparatus 20 comprises a fixing body 21 (being an identical member with the fixing body 11), a Y-direction vibrating body 22 fixed to the fixing body 21, and a Y-direction power-generating body 23 installed to the Y-direction vibrating body 22.

The X-direction vibrating body 12 is formed as a long-length plate-like shape. So as to make the leading-end side of the X-direction vibrating body 12 vibrate in the X-direction, the base end of the X-direction vibrating body 12 is fixed to the fixing body 11. The X-direction power-generating body 13 is installed to one of the leading-end-side opposite faces of the X-direction vibrating body 12. The Y-direction vibrating body 22 is formed as a long-length plate-like shape. So as to make the leading-end side of the Y-direction vibrating body 22 vibrate in the Y-direction, the base end of the Y-direction vibrating body 22 is fixed to the fixing body 21. The Y-direction power-generating body 23 is installed to one of the leading-end-side opposite faces of the Y-direction vibrating body 12. Here, the X-direction power-generating body 13 and Y-direction power-generating body 23 are made up of a substantially identical construction, although the installation objects are different from one another.

Next, regarding the X-direction power-generating body 13, explanations will be made with reference to FIG. 2. As illustrated in FIG. 2, the X-direction vibrating body 13 includes a magnetostrictive rod 51, a coil 52, a first magnet 52, a second magnet 54, and a yoke 55. The magnetostrictive rod 51 is formed by a magnetic material, and is installed to one of the opposite faces of the X-direction vibrating body 12. The magnetostrictive rod undergoes expansive deformations or compressive deformations in the longitudinal direction of the magnetostrictive rod 51, accompanied by X-direction vibrations of the X-direction vibrating body 12. That is, by the expansive deformations or compressive deformations of the magnetostrictive rod 51, an inverse magnetostriction effect arises, in which a longitudinal-direction magnetic flux density in the magnetostrictive rod 51 changes.

The coil 52 is wound around the magnetostrictive rod 51. Induction currents occur in the coil 52 by changing a core-direction magnetic flux density in the coil 52 by means of the inverse magnetostriction effect of the magnetostrictive rod 51. The first magnet 53 is disposed at one of the opposite ends of the magnetostrictive rod 51, and the second magnet 54 is disposed at another one of the opposite ends of the magnetostrictive rod 51. The yoke 55 couples the first magnet 53 with the second magnet 54. That is, a magnetic circuit is formed in the following order: the magnetostrictive rod 51→the first magnet 53→the yoke 55→the second magnet 54→the magnetostrictive rod 51. Magnetic-flux directions in the first magnet 53 and second magnet 54 are set up so as to point in the same directions in the magnetic circuit.

When the X-direction vibrating body 12 moves in one of the opposite X-directions, the magnetostrictive rod 51 undergoes expansive deformations. In this instance, the magnetic flux density in the magnetic circuit involving the magnetostrictive rod 51 changes, and thereby currents flow in the coil 52 in one of the opposite directions. On the contrary, when the X-direction vibrating body 12 moves in another one of the opposite X-directions, the magnetostrictive rod 51 undergoes compressive deformations. In this instance, the magnetic flux density in the magnetic circuit involving the magnetostrictive rod 51 changes, and thereby currents flow in the coil 52 in another one of the opposite directions. By the thus vibrating X-direction vibrating body 12, alternating currents occur in the coil 52.

By disposing the first magnet 53 and second magnet 54, it is possible to cause magnetization in the magnetic circuit in a biased manner. Therefore, to the magnetostrictive rod 51, even materials not provided with any residual magnetization become applicable. As aforementioned, in the X-direction power-generating body 13, although a magnetic circuit is formed by disposing the first magnet 53 and second magnet 54, it is also feasible to construct it without using any magnet. In this instance, the X-direction power-generating body 13 comes to be constructed by the magnetostrictive rod 51 and yoke 55.

As described above, whereas the first power generation apparatus 10 outputs alternating voltages by the vibrations of the X-direction vibrating body 12 (equal to a "first vibrating body"); the second power generation apparatus 20 outputs alternating voltages by the vibrations of the Y-direction vibrating body 22 (equal to a "second vibrating body"). That is, the power generation system 100 comes to generate electric power in modes, which differ respectively, while utilizing the vibrations in two different directions. Therefore, the alternating voltages that the first power generation apparatus 10 outputs, and the alternating voltages that the second power generation apparatus 20 outputs are alternating voltages with different phases.

Note that, in the present embodiment, although the first power generation apparatus 10 and second power generation apparatus 20 have been explained as a power generation apparatus using the magnetostrictive rod 51, it is also possible to use a piezoelectric element, and the like, for instance, as far as outputting alternating voltages by an input of vibrations.

(Circuit Construction of Power Generation System)

Next, regarding the power generation system 100 using the above-described first power generation apparatus 10 and second power generation apparatus 20, explanations will be made with reference to FIG. 3 and FIG. 4. The power generation system 100 comprises the first power generation apparatus 10, the second power generation apparatus 20, a first voltage-doubling rectifier circuit 110, a second voltage-doubling rectifier circuit 120, and a constant-current circuit 130. The first voltage-doubling rectifier circuit 110, and the second voltage-doubling rectifier circuit 120 have an identical circuit construction. Here, the first power generation apparatus 10 and first voltage-doubling rectifier circuit 110 construct a "first power-generation circuital unit," and the second power generation apparatus 20 and second voltage-doubling rectifier circuit 120 construct a "second power-generation circuital unit."

The first voltage-doubling rectifier circuit 110 not only rectifies the alternating voltages output by the first power generation apparatus 10 to store electricity, but also outputs enhanced voltages to the load instrument 200. The second voltage-doubling rectifier circuit 120 not only rectifies the alternating voltages output by the second power generation apparatus 20 to store electricity, but also outputs enhanced voltages to the load instrument 200. The first voltage-doubling rectifier circuit 110, and the second voltage-doubling rectifier circuit 120 are connected in series.

The first voltage-doubling rectifier circuit 110 includes a positive-side diode ill, a negative-side diode 112, a positive-side capacitor 113, and a negative-side capacitor 114. The positive-side capacitor 113, and the negative-side capacitor 114 are connected in series. The anode of the positive-side diode 111 is connected to one of the opposite ends of the first power generation apparatus 10, and the cathode of the positive-side diode 111 is connected to one of the opposite ends of the positive-side capacitor 113 (i.e., an electrode across from the negative-side capacitor 114). The anode of the negative-side diode 112 is connected to one of the opposite ends of the negative-side capacitor 114 (i.e., an electrode side across from the positive-side capacitor 113). The cathode of the negative-side diode 112 is connected to one of the opposite ends of the first power generation apparatus 10, and to the anode of the positive-side diode 111. Another one of the opposite ends of the positive-side capacitor 113, and another one of the opposite ends of the negative-side capacitor 114 are connected to another one of the opposite ends of the first power generation apparatus 10.

That is, when an opposite-end side of the first power generation apparatus 10 makes a positive-electrode voltage as shown with the dotted-line arrows in FIG. 3, a first circuit 141, which not only passes through the positive-side diode 111 but also stores electricity in the positive-side capacitor 113, is formed. On this occasion, an opposite-end side of the positive-side capacitor 113 (i.e., the upper side thereof in FIG. 3) makes a positive electrode. On the other hand, when another opposite-end side of the first power generation apparatus 10 makes a positive-electrode voltage as shown with the dotted-line arrows in FIG. 4, a first circuit 151, which not only passes through the negative-side diode 112 but also stores electricity in the negative-side capacitor 114, is formed. On this occasion, another opposite-end side of the negative-side capacitor 114 (i.e., the upper side thereof in FIG. 4) makes a positive electrode. That is, the positive-side capacitor 113 in FIG. 3, and the negative-side capacitor 114 in FIG. 4 are connected in series so as to direct the positive-electrode sides in an identical direction. Therefore, the first voltage-doubling rectifier circuit 110 outputs voltages, which are approximately twice as much as an absolute value of the voltages generated by the first power generation apparatus 10, by connecting the positive-side capacitor 113 and the negative-side capacitor 114 in series.

The second voltage-doubling rectifier circuit 120 includes a positive-side diode 121, a negative-side diode 122, a positive-side capacitor 123, and a negative-side capacitor 124. The positive-side capacitor 123, and the negative-side capacitor 124 are connected in series. The anode of the positive-side diode 121 is connected to one of the opposite ends of the second power generation apparatus 20, and the cathode of the positive-side diode 121 is connected to one of the opposite ends of the positive-side capacitor 123 (i.e., an electrode side across from the negative-side capacitor 124). The anode of the negative-side diode 122 is connected to one of the opposite ends of the negative-side capacitor 124 (i.e., an electrode side across from the positive-side capacitor 123). The cathode of the negative-side capacitor 122 is connected to one of the opposite ends of the second power generation apparatus 20, and to the anode of the positive-side diode 121. Another one of the opposite ends of the positive-side capacitor 123, and another one of the opposite ends of the negative-side capacitor 124 are connected to another one of the opposite ends of the second power generation apparatus 20.

In the same manner as the first voltage-doubling rectifier circuit 110, the second voltage-doubling rectifier circuit 120 outputs voltages, which are approximately twice as much as an absolute value of the voltages generated by the second power generation apparatus 20, by connecting the positive-side capacitor 123 and the negative-side capacitor 124 in series.

Here, the second voltage-doubling rectifier circuit 120 is connected in series to the first voltage-doubling rectifier circuit 110. More specifically, the positive-side capacitor 113 and negative-side capacitor 114 in the first voltage-doubling rectifier circuit 110 are connected in series to the positive-side capacitor 123 and negative-side capacitor 124 in the second voltage-doubling rectifier circuit 120.

The constant-current circuit 130 is connected in series to the load instrument 200. Moreover, the constant-current circuit 130 is connected in series to the positive-side capacitor 113 and negative-side capacitor 114 in the first voltage-doubling rectifier circuit 110, as well as to the positive-side capacitor 123 and negative-side capacitor 124 in the second voltage-doubling rectifier circuit 120. The constant-current circuit 130 limits currents, which flow to the load instrument 200, to a predetermined current or less. As for the constant-current circuit 130, a constant-current diode, or the like, is applied, for instance.

(Operations of Power Generation System)

Next, regarding operations of the power generation system 100, explanations will be made with reference to FIG. 3 and FIG. 4. As illustrated in FIG. 3, when one of the opposite ends of the first power generation apparatus 10 (i.e., the upper side in FIG. 3) makes a positive-electrode voltage, the first circuit 141 shown with the dotted-line arrows, and the second circuit 142 shown with the chain-double-dashed-line arrows are formed. The first circuit 141 is a circuit in which currents flow in the following order: one of the opposite ends of the first power generation apparatus 10→the positive-side diode 111→the positive-side capacitor 113→another one of the opposite ends of the first power generation apparatus 10. Due to the first circuit 141, electricity is stored in the positive-side capacitor 113 so as to make one of the opposite ends of the positive-side capacitor 113 (i.e., an opposing-side electrode to the negative-side capacitor 114) a positive electrode by voltages generated by the first power generation apparatus 10.

The second circuit 142 is a circuit in which currents flow in the following order: one of the opposite ends of the first power generation apparatus 10→the positive-side diode 111 in the first voltage-doubling rectifier circuit 110→the constant-current circuit 130→the load instrument 200→the negative-side capacitor 124 in the second voltage-doubling rectifier circuit 120→the positive-side capacitor 123 in the second voltage-doubling rectifier circuit 120→the negative-side capacitor 114 in the first voltage-doubling rectifier circuit 110→another one of the opposite ends of the first power generation apparatus 10. Due to the second circuit 142, electricity is stored in the negative-side capacitor 114 so as to make one of the opposite ends of the negative-side capacitor 114 (i.e., an opposing-side electrode to the positive-side capacitor 113) a positive electrode by voltages generated by the first power generation apparatus 10.

That is, a current "i0" flowing in the positive-side diode 111 is divided into a current "i1" flowing toward a side of the positive-side capacitor 113 in the first circuit 141, and a current "i2" flowing toward a side of the load instrument 200 in the second circuit 142. Since the second circuit 142 passes through the constant-current circuit 130, the current "i2" flowing to the second circuit 142 becomes a predetermined current or less that is limited by the constant-current circuit 130. Therefore, the load instrument 200 carries out an operation depending on the current "i2." For example, when the load instrument 200 is an LED illumination instrument, brightness of the LED illumination instrument becomes brightness depending on the current "i2." Here, as illustrated in FIG. 3, the current "i1" is set to be sufficiently greater than the current "i2." If so, a voltage between the opposite ends of the positive-side capacitor 113 is greater than a voltage between the opposite ends of the negative-side capacitor 114.

Figure 4:
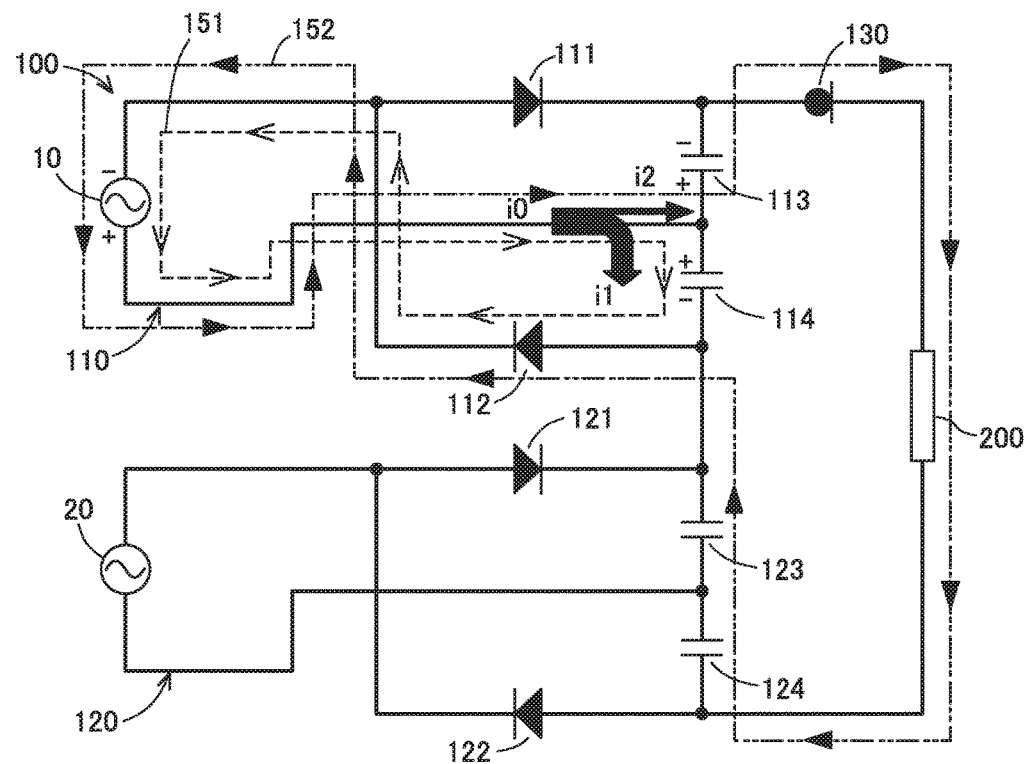
FIG. 4 illustrates another circuit construction of the power generation system in First Embodiment, wherein, when the lower side of the diagram of the first power generation apparatus makes a positive electrode, the first circuit is specified with the dashed lines and the second circuit is specified with the chain double-dashed lines.

Next, as illustrated in FIG. 4, when another one of the opposite ends of the first power generation apparatus 10 (i.e., the lower side in FIG. 4) makes a positive-electrode voltage, the first circuit 151 shown with the dotted-line arrows, and the second circuit 152 shown with the chain-double-dashed-line arrows are formed.

The first circuit 151 is a circuit in which currents flow in the following order: another one of the opposite ends of the first power generation apparatus 10→the negative-side capacitor 114→the negative-side diode 112→one of the opposite ends of the first power generation apparatus 10. Due to the first circuit 151, electricity is stored in the negative-side capacitor 114 so as to make another one of the opposite ends of the negative-side capacitor 114 (i.e., an electrode on a side of the positive-side capacitor 113) a positive electrode by voltages generated by the first power generation apparatus 10.

The second circuit 152 is a circuit in which currents flow in the following order: another one of the opposite ends of the first power generation apparatus 10→4 the positive-side capacitor 113 in the first voltage-doubling rectifier circuit 110→the constant-current circuit 130→the load instrument 200→the negative-side capacitor 124 in the second voltage-doubling rectifier circuit 120→the positive-side capacitor 123 in the second voltage-doubling rectifier circuit 120→the negative-side diode 112 in the first voltage-doubling rectifier circuit 110→one of the opposite ends of the first power generation apparatus 10. Due to the second circuit 152, electricity is stored in the positive-side capacitor 113 so as to make another one of the opposite ends of the positive-side capacitor 113 (i.e., an electrode on a side of the negative-side capacitor 114) a positive electrode by voltages generated by the first power generation apparatus 10.

That is, a current "i0" flowing in another one of the opposite ends of the first power generation apparatus 10 is divided into a current "i1" flowing toward a side of the negative-side capacitor 114 in the first circuit 151, and a current "i2" flowing toward a side of the load instrument 200 in the second circuit 152. Since the second circuit 152 passes through the constant-current circuit 130, the current "i2" flowing to the second circuit 152 becomes a predetermined current or less that is limited by the constant-current circuit 130. Therefore, the load instrument 200 carries out an operation depending on the current "i2." Here, as illustrated in FIG. 4, the current "i1" is set to be sufficiently greater than the current "i2." If so, a voltage between the opposite ends of the negative-side capacitor 114 is greater than a voltage between the opposite ends of the positive-side capacitor 113.

Since the first power generation apparatus 10 outputs alternating voltages, the state shown in FIG. 3, and the state shown in FIG. 4 are repeated. The direction of currents flowing in the positive-side capacitor 113 in FIG. 3 is different from the direction of currents flowing in the positive-side capacitor 113 in FIG. 4. Moreover, the direction of currents flowing in the negative-side capacitor 114 in FIG. 3 is different from the direction of currents flowing in the negative-side capacitor 114 in FIG. 4.

That is, even when electricity is stored in the positive-side capacitor 113 by the first circuit 141 shown in FIG. 3, the positive-side capacitor 113 comes to be discharged by the second circuit 152 shown in FIG. 4. Simultaneously, even when electricity is stored in the negative-side capacitor 114 by the first circuit 151 shown in FIG. 4, the negative-side capacitor 114 comes to be discharged by the second circuit 142 shown in FIG. 3.

However, the constant-current circuit 130 limits currents flowing to the load instrument 200. That is, currents flowing to the second circuits (142, 152) are limited. Consequently, when the current "i0" output by the first power generation apparatus 10 is sufficiently greater than the predetermined current "i2," the current "i1" flowing to the first circuits (141, 151) in which the load instrument 200 does not intervene becomes greater than the current "i2" flowing to the second circuits (142, 152) in which the load instrument 200 intervenes. Therefore, a charge corresponding to the current difference ("i1"–"i2") is stored in each of the positive-side capacitor 113 and negative-side capacitor 114. By thus limiting currents flowing to the load instrument 200 by the constant-current circuit 130, it becomes feasible to store electricity securely in each of the positive-side capacitor 113 and negative side capacitor 114 in the first voltage-doubling rectifier circuit 110.

The second voltage-doubling rectifier circuit 120 carries out operations similar to those of the first voltage-doubling rectifier circuit 110. However, due to the second circuits (142, 152) which result from the power generation by the first power generation apparatus 10, the current "i2" flows in the positive-side capacitor 123 and negative-side capacitor 124 in the second voltage-doubling rectifier circuit 120, as described above. In the second voltage-doubling rectifier circuit 120, the direction of the current "i2" differs, due to the first circuits (141, 151) which result from the power generation by the second power generation apparatus 20, from that of the current "i1" that flows in the positive-side capacitor 123 and negative-side capacitor 124 in the second voltage-doubling rectifier circuit 120. Even taking the fact into consideration, however, when the current "i1" is sufficiently greater than the current "i2," it becomes feasible to store electricity in each of the capacitors (113, 114, 123, 124) by disposing the constant-current circuit 130, even in such a case as the first voltage-doubling rectifier circuit 110 and the second voltage-doubling rectifier circuit 120 are connected in series.

In particular, the alternating voltages, which the first power generation apparatus 10 outputs, and the alternating voltages, which the second power generation apparatus 20 outputs, are alternating voltages with different phases. It is likely that, when the second power generation apparatus 20 is put in a state of not generating electricity, thus outputting the alternating voltages with different phases, respectively, might lead to forming the second circuits (142, 152), in which the load instrument 200 intervenes, in the first voltage-doubling rectifier circuit 110. However, even in such a case as the phases differ, it becomes feasible to store electricity securely in each of the capacitors (113, 114, 123, 124) by disposing the constant-current circuit 130.

Second Embodiment

In First Embodiment, the power generation system 100 is set to comprise the two power generating apparatuses (10, 20). In addition to this, the power generation system 100 can comprise three power generating apparatuses (10, 20, 30), wherein each of the rectifier circuits can be connected in series.

Figure 5:
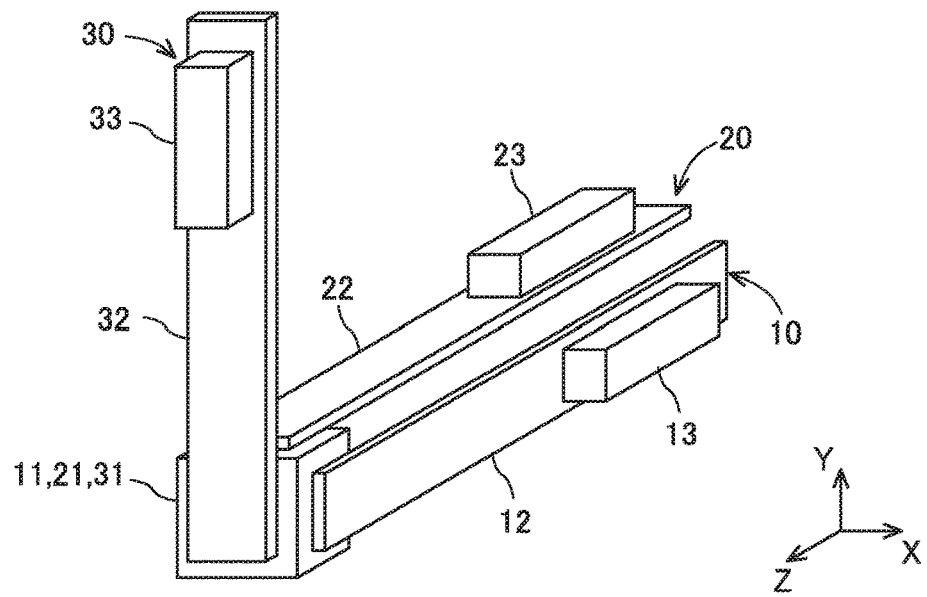
FIG. 5 is a diagram illustrating first, second and third power generation apparatuses which construct a power generation system in Second Embodiment.

Regarding the three power generation apparatuses (10, 20, 30) constructing the power generation system 100 in Second Embodiment, explanations will be made with reference to FIG. 5. The first power generation apparatus 10 and second power generation apparatus 20 have the same constructions as those in First Embodiment. The third power generation apparatus 30 includes a fixing body 31 serving as an identical member with the fixing bodies (11, 21), a Z-direction vibrating body 32 fixed to the fixing body 31, and a Z-direction power-generating body 33 installed to the Z-direction vibrating body 32.

The Z-direction vibrating body 32 is formed as a long-length plate-like shape. So as to make the leading-end side of the Z-direction vibrating body 32 vibrate in the Z-direction, the base end of the Z-direction vibrating body 32 is fixed to the fixing body 31. The Z-direction power-generating body 33 is installed to one of the leading-end-side opposite faces of the Z-direction vibrating body 32. The Z-direction power-generating body 33 is made up of a substantially identical construction with those of the X-direction power-generating body 13 and Y-direction power-generating body 23, although the installation objects are different from each other.

That is, the Z-direction power-generating apparatus 33 outputs alternating voltages by the vibrations of the Z-direction vibrating body 32 (equal to a "third vibrating body"). That is, the power generation system 100 comes to generate electric powers in modes, which differ respectively, while utilizing the vibrations in three different directions. Therefore, the alternating voltages, which the first, second and third power generation apparatuses (10, 20, 30) output respectively, are alternating voltages with different phases.

Each of the capacitors (not shown) in a third voltage-doubling rectifier circuit (not shown) is connected in series to each of the capacitors (113, 114) in the first voltage-doubling rectifier circuit 110, and to each of the capacitors (123, 124) in the second voltage-doubling rectifier circuit 120. Even if such is the case, it becomes feasible to store electricity in each of the capacitors (113, 114, 123, 124).

Third Embodiment

Figure 6:
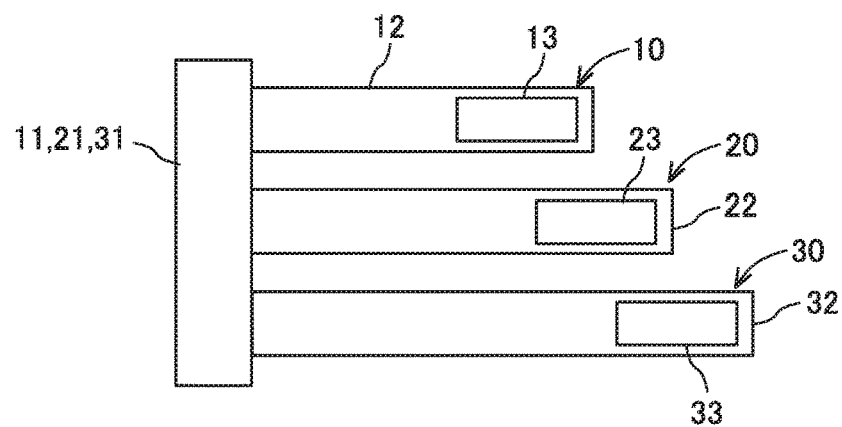
FIG. 6 is a diagram illustrating first, second and third power generation apparatuses which construct a power generation system in Third Embodiment.

In First and Second Embodiments, the alternating voltages, which each of the power generation apparatuses (10, 20, 30) outputs, are set to have different phases by making the vibration directions of the vibrating bodies (12, 22, 32) different. In addition to this, the first, second and third vibrating bodies (12, 22, 32) are set so as to have different lengths, as shown in FIG. 6. That is, the first, second and third vibrating bodies (12, 22, 32) have different resonance frequencies; as a result, alternating voltages, which the first, second third power-generating bodies (13, 23, 33) installed respectively to the first, second and third vibrating bodies (12, 22, 32) output, have different phases. Also in this instance, it becomes feasible to store electricity securely in each of the capacitors (113, 114, 123, 124) in the same manner as aforementioned. Note that, in order to make the resonance frequencies of the first, second and third vibrating bodies (12, 22, 32) different, it is also allowable to make the first, second and third (12, 22, 32) have different masses.

Fourth Embodiment

Figure 7:
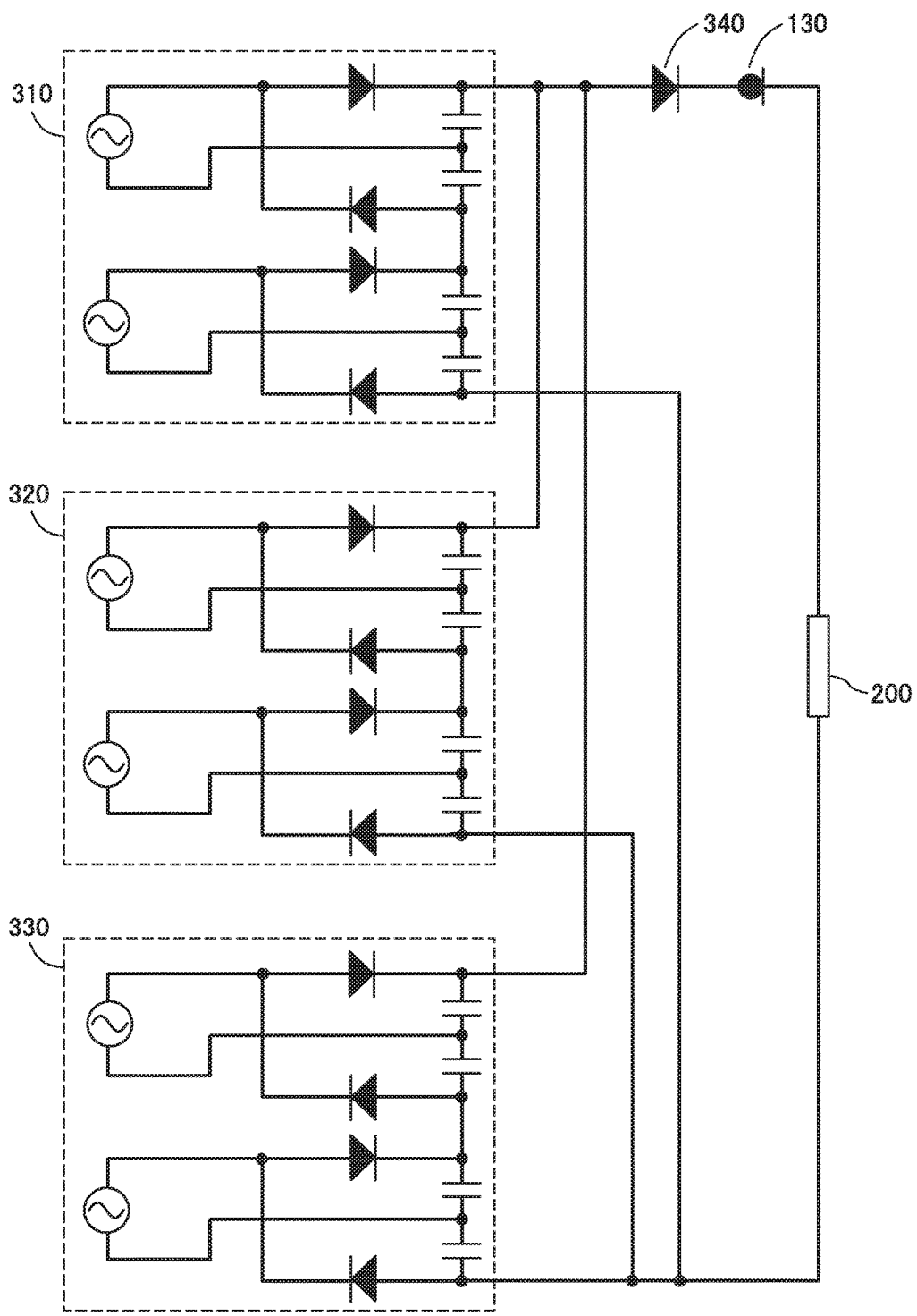
FIG. 7 is a diagram illustrating a circuit construction of a power generation system in Fourth Embodiment.

The power generation system 100 in the aforementioned embodiments is set to have the construction in which the rectifier circuits (110, 120) to be connected to the multiple power generation apparatuses (10, 20, 30) are connected in series. As illustrated in FIG. 7, a power generation system in the present embodiment comprises a plurality of in-line units (310, 320, 330), which include the multiple power generation apparatuses (10, 20, 30) and the voltage-doubling rectifier circuits (110, 120) corresponding to them. The first, second and third in-line units (310, 320, 330) are connected in parallel. Moreover, a diode 340 for backflow prevention, and the constant-current circuit 130 are connected in series to the load instrument 200.

Figure 8:
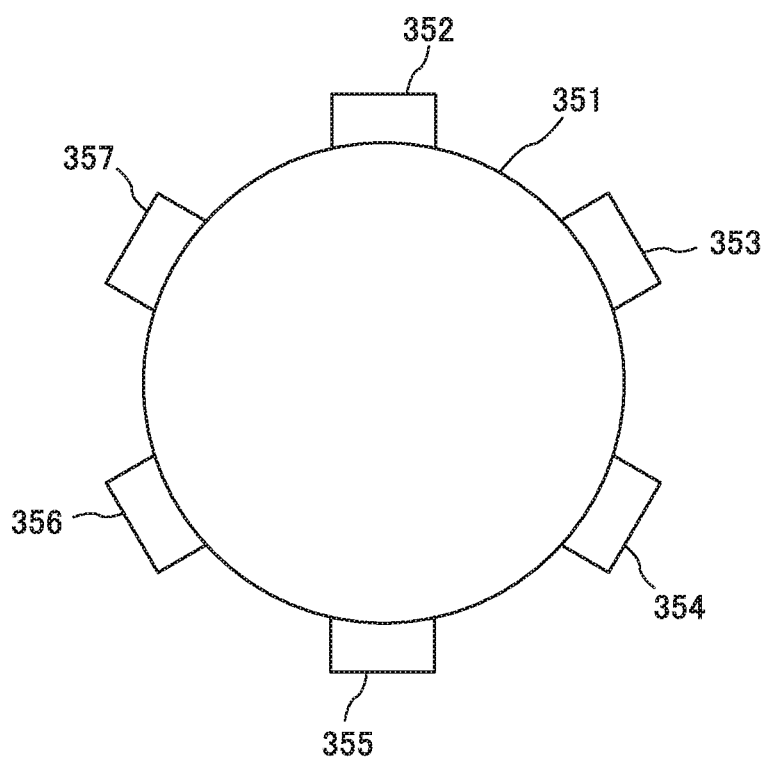
FIG. 8 is a diagram illustrating a construction of the power generation system in Fourth Embodiment.

As illustrated in FIG. 8, the power generation system in the present embodiment can comprise a vibrating body 351 supported vibratably, and formed as a tubular shape. In an outer peripheral face of the vibrating body 351, first through sixth power-generating bodies (352 through 357) constructing first through sixth power generation apparatuses are disposed at positions with different phases respectively. The first through sixth power-generating bodies (352 through 357) output alternating voltages by vibrations in directions corresponding to the phases of the vibrating body 351 to which they are installed. The first and fourth power-generating bodies (352, 355) output alternating voltages with an identical phase, the second and fifth power-generating bodies (353, 356) output alternating voltages with an identical phase, and the third and sixth power-generating bodies (354, 357) output alternating voltages with an identical phase. The first power-generating body 352 outputs alternating voltages whose phase differs with respect to those of the second, third, fifth and sixth power-generating bodies (353, 354, 356, 357).

For example, the first in-line unit 310 comprises first and second power generation apparatuses including the first and second power-generating bodies (352, 353) with different phases. The second in-line unit 320 comprises third and fourth power generation apparatuses including the third and fourth power-generating bodies (354, 355) with different phases. The third in-line unit 330 comprises fifth and sixth power generation apparatuses including the fifth and sixth power-generating bodies (356, 357) with different phases. Also in this instance, it becomes feasible to store electricity securely in each of the capacitors in the same manner as aforementioned.

The more a number of the power generation apparatuses is increased, the greater become the currents output by all of the power generation apparatuses naturally in a case where the rectifier circuits corresponding to all of the power generation apparatuses are connected in series. However, when the constant-current circuit 130 limits the currents flowing to the load instrument 200, the greater a supply-source current into the constant-current circuit 130 is, the greater becomes a loss in the constant-current circuit 130. Consequently, the supply-source current into the constant-current circuit 130 being great excessively is not preferable. Hence, by connecting the first, second and third in-line units (310, 320, 330) in parallel, it is possible to inhibit the supply-source current into the constant-current circuit 130 from becoming great excessively, and accordingly it is possible to inhibit the loss in the constant-current circuit 130. Note that, in the present embodiment, although the first through sixth power-generating bodies (352 through 357) are set to be disposed on an outer peripheral face of the vibrating body 351, it is also allowable to dispose them on an inner peripheral surface of the vibrating body 351.

Modified Form of the Aforementioned Embodiments

In the aforementioned embodiments, the rectifier circuits corresponding to the second and third power generation apparatuses are set to be a voltage-doubling rectifier circuit, respectively. In addition to this, when a rectifier circuit corresponding to the first power generation apparatus 10 is the first voltage-doubling rectifier circuit 110, rectifier circuits corresponding to the second and third power generation apparatuses (20, 30) effect the same advantages as aforementioned even when a full-wave rectifier circuit is applied respectively to them, for instance.

Fifth Embodiment

A power generation system 400 according to Fifth Embodiment comprises three power generation apparatuses (10, 20, 30) in the same manner as the power generation system 100 according to aforementioned Second Embodiment. However, in Fifth Embodiment, explanations will be hereinafter made while labeling them as three power generation apparatuses (410a, 420a, 430a) instead.

Figure 9:
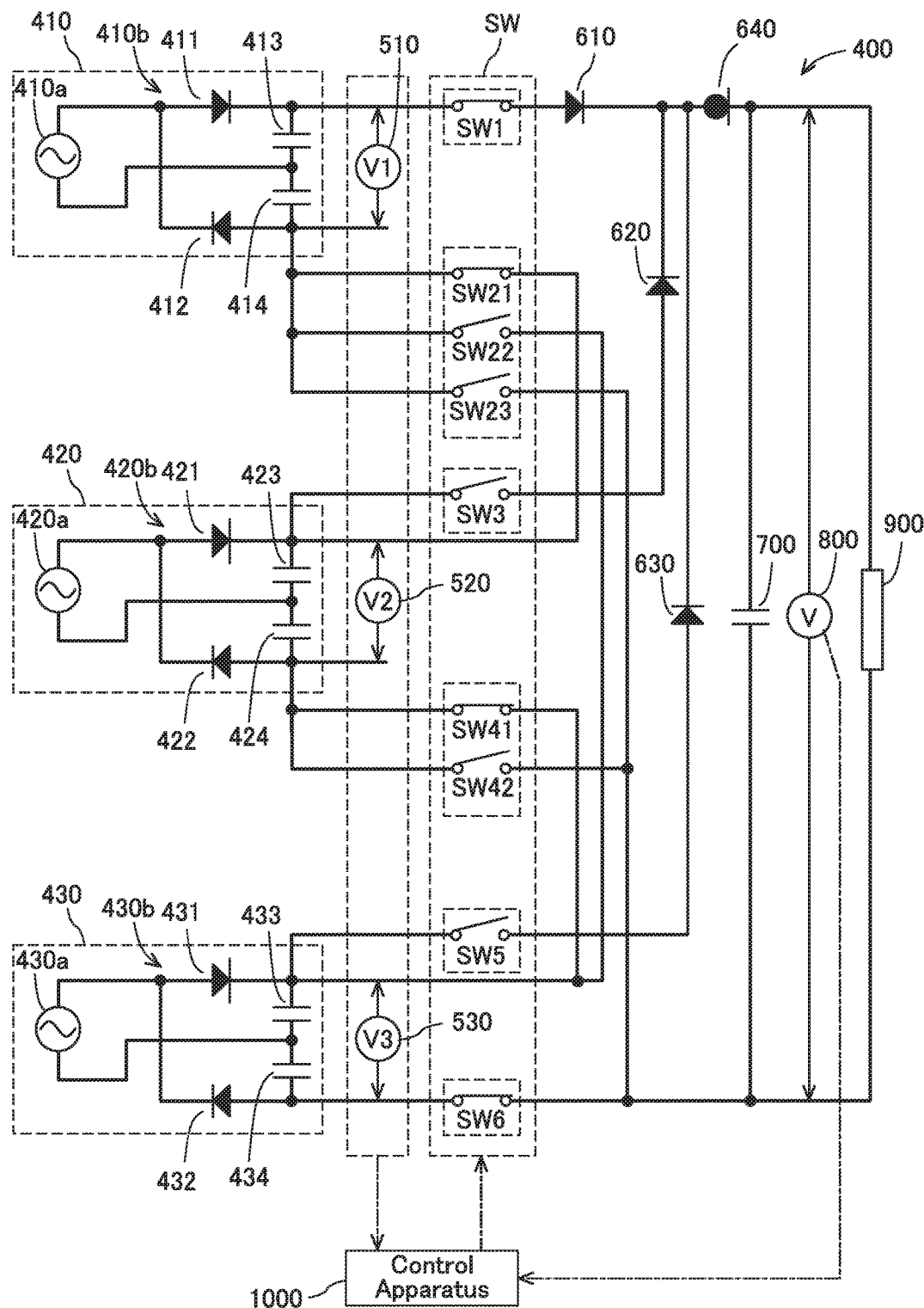
FIG. 9 is a diagram illustrating a circuit construction of a power generation system in Fifth Embodiment.

Regarding the power generation system 400 according to Fifth Embodiment, explanations will be made with reference to FIG. 9. The power generation system 400 outputs generated electric powers to a load instrument 900. Regarding the first, second and third power generation apparatuses (410a, 420a, 430a), which construct the power generation system 400, they are the same as the three power generating apparatuses (10, 20, 30) in the aforementioned embodiments. That is, the first, second and third power generation apparatuses (410a, 420a, 430a) output alternating voltages by an input of vibrations.

The first power generation apparatus 410a outputs alternating voltages by the vibrations of the X-direction vibrating body 12 (equal to a "first vibrating body"), the second power generation apparatus 420a outputs alternating voltages by the vibrations of the Y-direction vibrating body 22 (equal to a "second vibrating body"), and the third power generation apparatus 430a outputs alternating voltages by the vibrations of the Z-direction vibrating body 32 (equal to a "third vibrating body"). That is, the power generation system 400 comes to generate electricity in modes, which differ respectively, while utilizing the vibrations in three different directions. Therefore, the alternating voltages that the first power generation apparatus 410a outputs, the alternating voltages that the second power generation apparatus 420a outputs, and the alternating voltages that the third power generation apparatus 430a outputs are alternating voltages with different phases.

Note that, in the present embodiment, although the first power generation apparatus 410a, second power generation apparatus 420a and third power generation apparatus 430a have been explained as a power generation apparatus using the magnetostrictive rod 51, it is also possible to use a piezoelectric element, and the like, for instance, as far as outputting alternating voltages by an input of vibrations.

(Circuit Construction of Power Generation System)

Next, regarding the power generation system 400 using the above-described first power generation apparatus 410*a*, second power generation apparatus 420*a* and third power generation apparatus 430*a*, explanations will be made with reference to FIG. 9. The power generation system 400 comprises first, second and third power-generation circuital units (410, 420, 430), output-voltage detectors (510, 520, 530), a switch SW, backflow-preventing diodes (610, 620, 630), a constant-current circuit 640, a smoothing capacitor 700 serving as a smoothing circuit, and an applied-voltage detector 800.

The respective power-generation circuital units (410, 420, 430) include the power generation apparatuses (410*a*, 420*a*, 430*a*), and rectifier circuits (410*b*, 420*b*, 430*b*). The power generation apparatuses (410*a*, 420*a*, 430*a*) are the same as those described above. The rectifier circuits (410*b*, 420*b*, 430*b*) will be explained while naming a voltage-doubling rectifier circuit as an example. Note that the rectifier circuits (410*b*, 420*b*, 430*b*) are not restricted to a voltage-doubling rectifier circuit at all, but a full-wave rectifier circuit can be applied to them.

The respective voltage-doubling rectifier circuits (410*b*, 420*b*, 430*b*) not only rectify the alternating voltages output by the respective power generation apparatuses (410*a*, 420*a*, 430*a*) to store electricity, but also output stored voltages to the load instrument 900. The first voltage-doubling rectifier circuit 410*b*, the second voltage-doubling rectifier circuit 420*b*, and the third voltage-doubling rectifier circuit 430*b* are connected in series. Note that, in what follows, "connecting the power-generation circuital units (410, 420, 430) in series" signifies "connecting the voltage-doubling rectifier circuits (410*b*, 420*b*, 430*b*) in series."

The first voltage-doubling rectifier circuit 410*b* includes a positive-side diode 411, a negative-side diode 412, a positive-side capacitor 413, and a negative-side capacitor 414. The positive-side capacitor 413, and the negative-side capacitor 414 are connected in series. The anode of the positive-side diode 411 is connected to one of the opposite ends of the first power generation apparatus 410*a*, and the cathode of the positive-side diode 411 is connected to one of the opposite ends of the positive-side capacitor 413 (i.e., an electrode side across from the negative-side capacitor 414). The anode of the negative-side diode 412 is connected to one of the opposite ends of the negative-side capacitor 414 (i.e., an electrode side across from the positive-side capacitor 413). The cathode of the negative-side diode 412 is connected to one of the opposite ends of the first power generation apparatus 410*a*, and to the anode of the positive-side diode 411. Another one of the opposite ends of the positive-side capacitor 413, and another one of the opposite ends of the negative-side capacitor 414 are connected to another one of the opposite ends of the first power generation apparatus 410*a*.

When an opposite-end side of the first power generation apparatus 410*a* (i.e., the upper side in FIG. 9) makes a positive-electrode voltage, a circuit, which not only passes through the positive-side diode 411 but also stores electricity in the positive-side capacitor 413, is formed. On this occasion, an opposite-end side of the positive-side capacitor 413 (i.e., the upper side in FIG. 9) makes a positive electrode. On the other hand, when another opposite-end side of the first power generation apparatus 410*a* (i.e., the lower side in FIG. 9) makes a positive-electrode voltage, another circuit, which not only passes through the negative-side diode 412 but also stores electricity in the negative-side capacitor 414, is formed. On this occasion, another opposite-end side of the negative-side capacitor 414 (i.e., the upper side in FIG. 9) makes a positive electrode. That is, the positive-side capacitor 413, and the negative-side capacitor 414 are connected in series so as to direct the positive-electrode sides in an identical direction. Therefore, the first voltage-doubling rectifier circuit 410*a* outputs voltages, which are approximately twice as much as an absolute value of the voltages generated by the first power generation apparatus 410*a*, by connecting the positive-side capacitor 413 and the negative-side capacitor 414 in series.

The second voltage-doubling rectifier circuit 420*b* in the second power-generation circuital unit 420 includes a positive-side diode 421, a negative-side diode 422, a positive-side capacitor 423, and a negative-side capacitor 424. The third voltage-doubling rectifier circuit 430*b* in the third power-generation circuital unit 430 includes a positive-side diode 431, a negative-side diode 432, a positive-side capacitor 433, and a negative-side capacitor 434. The second voltage-doubling rectifier circuit 420*b* and third voltage-doubling rectifier circuit 430*b* are made up of an identical construction with that of the first voltage-doubling rectifier circuit 410*b*.

The first output-voltage detector 510 detects an output voltage "V1" of the first voltage-doubling rectifier circuit 410*b* in the first power-generation circuit unit 410. To be concrete, the first output-voltage detector 510 detects an opposite-end voltage across the positive-side capacitor 413 and the negative-side capacitor 414. The second output-voltage detector 520 detects an output voltage "V2" of the second voltage-doubling rectifier circuit 420*b* in the second power-generation circuit unit 420. To be concrete, the second output-voltage detector 520 detects an opposite-end voltage across the positive-side capacitor 423 and the negative-side capacitor 424. The third output-voltage detector 530 detects an output voltage "V3" of the third voltage-doubling rectifier circuit 430*b* in the third power-generation circuit unit 430. To be concrete, the third output-voltage detector 530 detects an opposite-end voltage across the positive-side capacitor 433 and the negative-side capacitor 434.

The switch SW switches between a state of connecting each of the voltage-doubling rectifier circuits (410*b*, 420*b*, 430*b*) to the load instrument 900, and another state of shutting them off therefrom. A switch SW1 switches between a state of connecting one of the opposite ends of the positive-side capacitor 413 in the voltage-doubling rectifier circuit 410*b* to one of the opposite ends of the load instrument 900, and another state of shutting it off therefrom.

Switches (SW21 through SW23) switch connection objects to one of the opposite ends of the negative-side capacitor 414 in the first voltage-doubling rectifier circuit 410*b*. The switch SW21 switches between a state of connecting the opposite end of the negative-side capacitor 414 to one of the opposite ends of the positive-side capacitor 423 in the second voltage-doubling rectifier circuit 420*b*, and another state of shutting it off therefrom. The switch SW22 switches between a state of connecting the opposite end of the negative-side capacitor 414 to one of the opposite ends of the positive-side capacitor 433 in the third voltage-doubling rectifier circuit 430*b*, and another state of shutting it off therefrom. The switch SW23 switches between a state of connecting the opposite end of the negative-side capacitor 414 to another one of the opposite ends of the load instrument 900, and another state of shutting it off therefrom.

A switch SW3 switches between a state of connecting one of the opposite ends of the positive-side capacitor 423 in the second voltage-doubling rectifier circuit 420*b* to one of the opposite ends of the load instrument 900, and another state of shutting it off therefrom. Switches (SW41 through SW42) switch connection objects to one of the opposite ends of the negative-side capacitor 424 in the second voltage-doubling rectifier circuit 420b. The switch SW41 switches between a state of connecting the opposite end of the negative-side capacitor 424 to one of the opposite ends of the positive-side capacitor 433 in the third voltage-doubling rectifier circuit 420c, and another state of shutting it off therefrom. The switch SW42 switches between a state of connecting the opposite end of the negative-side capacitor 424 to another one of the opposite ends of the load instrument 900, and another state of shutting it off therefrom.

A switch SW5 switches between a state of connecting one of the opposite ends of the positive-side capacitor 433 in the third voltage-doubling rectifier circuit 430b to one of the opposite ends of the load instrument 900, and another state of shutting it off therefrom. A switch SW6 switches between a state of connecting one of the opposite ends of the negative-side capacitor 434 in the third voltage-doubling rectifier circuit 430b to another one of the opposite ends of the load instrument 900, and another state of shutting it off therefrom.

The backflow-preventing diode 610 is put in place between one of the opposite ends of the positive-side capacitor 413 in the first voltage-doubling rectifier circuit 410b and one of the opposite ends of the load instrument 900, and flows currents from the positive-side capacitor 413 to a side of the load instrument 900. The backflow-preventing diode 620 is put in place between one of the opposite ends of the positive-side capacitor 423 in the second voltage-doubling rectifier circuit 420b and the opposite end of the load instrument 900, and flows currents from the positive-side capacitor 423 to the side of the load instrument 900. The backflow-preventing diode 630 is put in place between one of the opposite ends of the positive-side capacitor 433 in the third voltage-doubling rectifier circuit 430b and the opposite end of the load instrument 900, and flows currents from the positive-side capacitor 433 to the side of the load instrument 900.

The constant-current circuit 640 is connected in series to the load instrument 900. Moreover, the constant-current circuit 640 is connected in series to the respective backflow-preventing diodes (610, 620, 630). The constant-current circuit 640 limits currents, which flow in the constant-current circuit 640 toward the load instrument 900, to a predetermined current or less. As for the constant-current circuit 640, a constant-current diode, or the like, is applied, for instance. The constant-current circuit 640 has functions equivalent to the functions resulting from the constant-current circuit 130 according to First Embodiment. That is, even when any of the first, second and third voltage-doubling rectifier circuits (410b, 420b, 430c) is connected in series, it becomes feasible to store electricity securely in the positive-side capacitors (413, 423, 433) and negative-side capacitors (414, 424, 434) in the first, second and third voltage-doubling rectifier circuits (410b, 420b, 430b) by the constant-current circuit 640.

The smoothing capacitor 700 (i.e., a smoothing circuit) is connected in parallel to the load instrument 900, and is caused to store electricity by the respective rectifier circuits (410b, 420b, 430b). That is, the smoothing capacitor 700 applies a stable voltage with respect to the load instrument 900. However, the smoothing capacitor 700 is caused to store electricity by a current that has been limited by the constant-current circuit 640.

The applied-voltage detector 800 detects an opposite-end voltage "V" across the smoothing capacitor 700. That is, the applied-voltage detector 800 detects a voltage "V" that is applied to the load instrument 900 by all of the power-generation circuital units (410, 420, 430). Since the applied-voltage detector 800 detects an opposite-end "V" across the smoothing capacitor 700, a voltage "V," which is applied onto the load instrument 900, is detected securely.

Based on the applied voltage "V" and output voltages ("V1," "V2," "V3"), the control apparatus 1000 not only determines at least one of the rectifier circuits (410b, 420b, 430b) to be connected to the load instrument 900 but also determines at least another one of the rectifier circuits (410b, 420b, 430b) to be shut off from the load instrument 900, and then controls the switch SW so as to make a determined state. Moreover, the control apparatus 1000 carries out an ON/OFF PWM control for turning on and off the switches (SW1, SW3, SW5) which connect the load instrument 900 with the rectifier circuits (410b, 420b, 430b). That is, based on the applied voltage "V" and output voltages ("V1," "V2," "V3"), the control apparatus 1000 adjusts the applied voltage "V." To be concrete, the control apparatus 1000 causes the applied voltage "V" to fall within a predetermined range that is higher than a voltage requested by the load instrument 900.

(Processes of Control Apparatus)

Regarding processes by the control apparatus 1000, explanations will be made with reference to FIG. 10 through FIG. 18. The control apparatus 1000 judges whether or not any of the output voltages ("V1," "V2," "V3") is higher than a threshold value "Vth," a voltage requested by the load instrument 900 (at "S1" in FIG. 10). When the condition is satisfied (i.e., "Y" at "S1"), the control apparatus 1000 judges whether or not the following are satisfied: "V1">"V2"; and "V1">"V3" (at "S2" in FIG. 10). When this condition is satisfied (i.e., "Y" at "S2"), the control apparatus 1000 connects the first power-generation circuital unit 410 to the load instrument 900, and then controls the switch SW so as to shut off the second and third power-generation circuital units (420, 430) from the load instrument 900 (at "S3" in FIG. 10).

Figure 12:
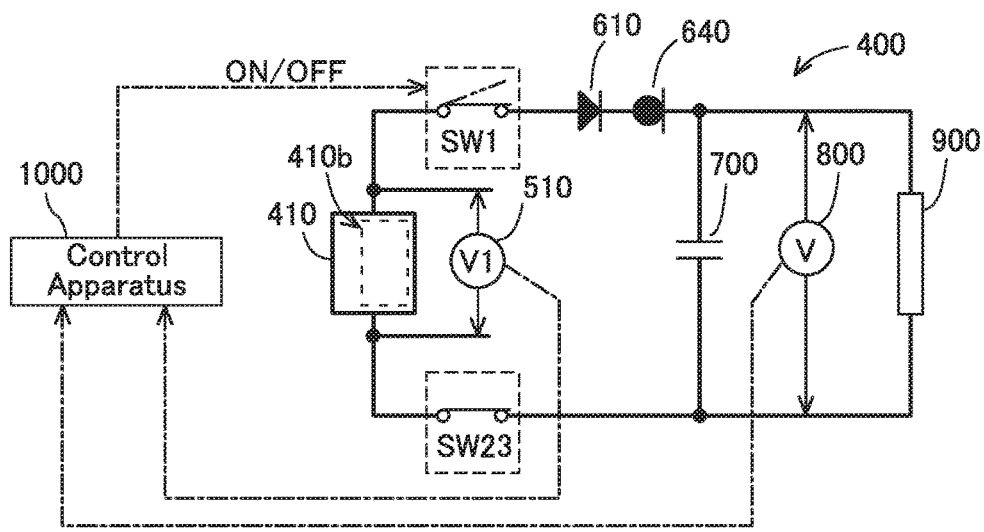
FIG. 12 is a circuit diagram at step "S3" shown in FIG. 10.

A circuit connected to the load instrument 900 on this occasion makes the circuit shown in FIG. 12. That is, the switch SW23 turns "ON," and the switches other than the switches (SW1, SW23) turn "OFF." Based on the applied voltage "V" and output voltage "V1," the control apparatus 1000 carries out an ON/OFF PWM control for turning on and off the switch SW1. That is, the control apparatus 1000 can make the applied voltage "V" a desired voltage by making the proportion of "ON" duty less when the output voltage "V1" is high, or by making the proportion of "ON" duty more when the output voltage "V1" is low.

And, the second and third power-generation circuital units (420, 430), which are not shown in FIG. 12, are shut off from the load instrument 900. Therefore, the second and third power-generation circuit units (420, 430) come to concentrate on storing generated electric charges. That is, the second and third power-generation circuital units (420, 430) can make the stored voltages higher.

When the output voltage "V1" of the first power-generation circuital unit 410 is greater than the other output voltages ("V2," "V3"), and when the output voltage "V1" is great sufficiently, only the first power-generation circuital unit 410 is used in order to output voltages with respect to the load instrument 900. Therefore, a desired voltage can be output with respect to the load instrument 900 for a long period of time, while the second and third power-generation circuital units (420, 430), which are shut off from the load instrument 900, store electricity efficiently.

Figure 10:
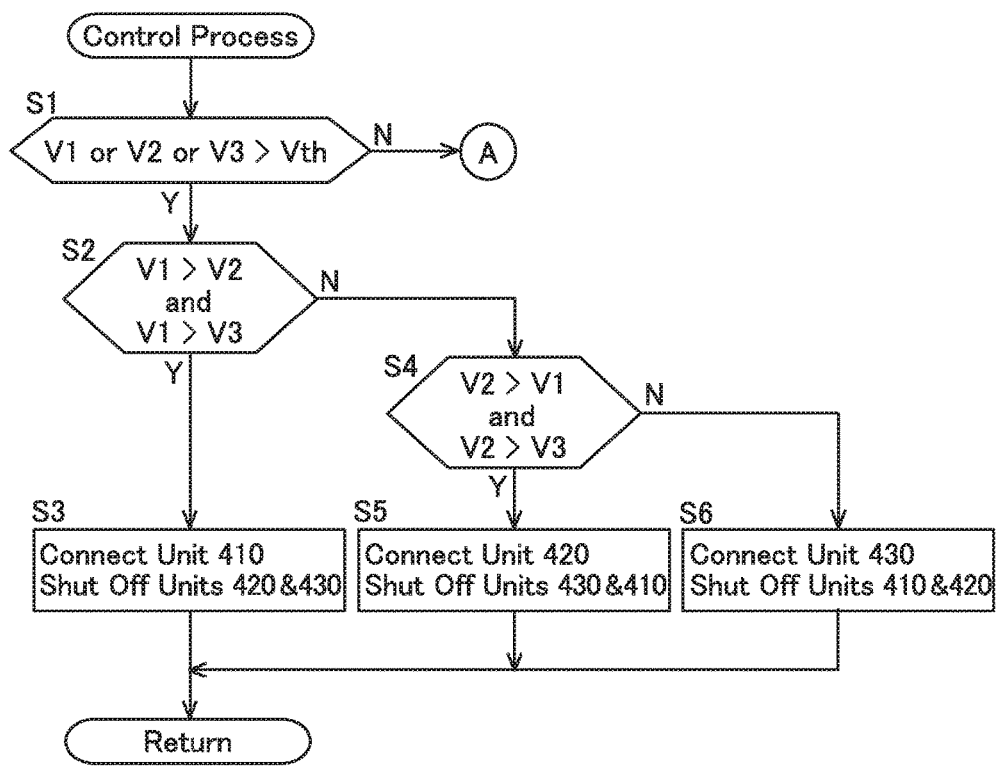
FIG. 10 is a flow chart illustrating processes of a control apparatus which is shown in FIG. 9.

At "S2" in FIG. 10, when the following are not satisfied: "V1">"V2"; and "V1">"V3" (i.e., "N" at "S2"), the control apparatus 1000 judges whether or not the following are satisfied: "V2">"V1"; and "V2">"V3" (i.e., at "S4" in FIG. 10). When this condition is satisfied (i.e., "Y" at "S4"), the control apparatus 1000 connects the second power-generation circuital unit 420 to the load instrument 900, and then controls the switch SW so as to shut off the first and third power-generation circuital units (410, 430) from the load instrument 900 (at "S5" in FIG. 10).

Figure 13:
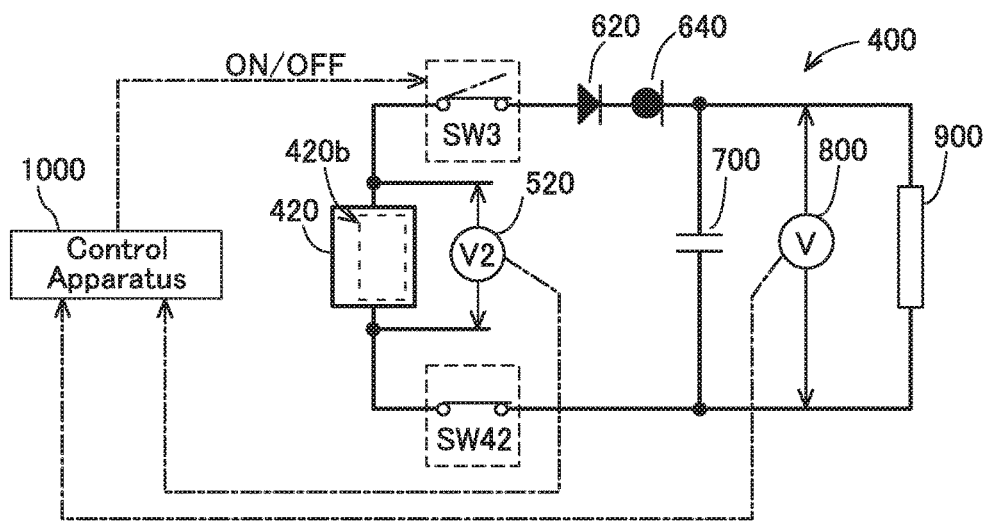
FIG. 13 is a circuit diagram at step "S5" shown in FIG. 10.

A circuit connected to the load instrument 900 on this occasion makes the circuit shown in FIG. 13. That is, the switch SW42 turns "ON," and the switches other than the switches (SW3, SW42) turn "OFF." Based on the applied voltage "V" and output voltage "V2," the control apparatus 1000 carries out an ON/OFF PWM control for turning on and off the switch SW3. That is, the control apparatus 1000 can make the applied voltage "V" a desired voltage by making the proportion of "ON" duty less when the output voltage "V2" is high, or by making the proportion of "ON" duty more when the output voltage "V2" is low.

When the output voltage "V2" of the second power-generation circuital unit 420 is greater than the other output voltages ("V1," "V3"), and when the output voltage "V2" is great sufficiently, only the second power-generation circuital unit 420 is used in order to output voltages with respect to the load instrument 900. Therefore, a desired voltage can be output with respect to the load instrument 900 for a long period of time, while the first and third power-generation circuital units (410, 430), which are shut off from the load instrument 900, store electricity efficiently.

At S4 in FIG. 10, when the following are not satisfied: "V2">"V1"; and "V2">"V3" (i.e., "N" at "S4"), the control apparatus 1000 connects the third power-generation circuital unit 430 to the load instrument 900, and then controls the switch SW so as to shut off the first and second power-generation circuital units (410, 420) from the load instrument 900 (at "S6" in FIG. 10). At "S4" in FIG. 10, the case where the following are not satisfied: "V2">"V1"; and "V2">"V3" is equal to the other case where the following are satisfied: "V3">"V1"; and "V3">"V2."

Figure 14:
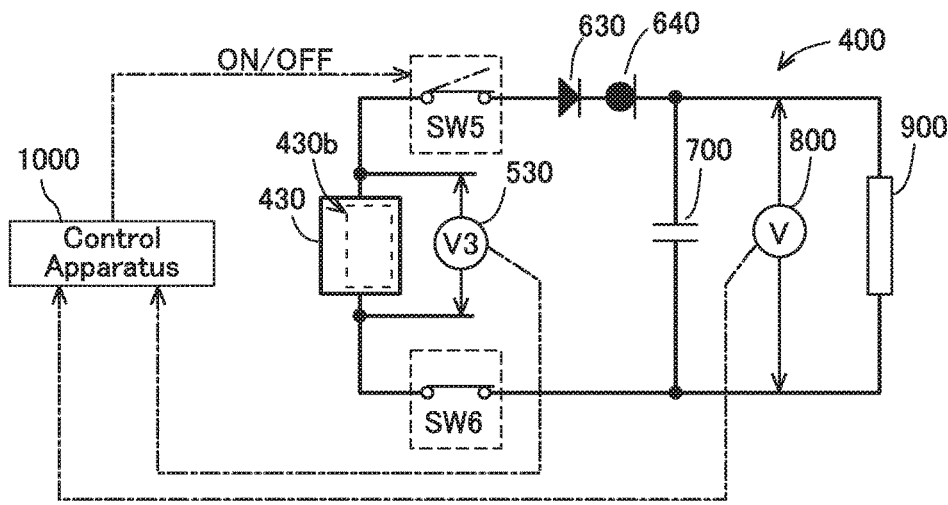
FIG. 14 is a circuit diagram at step "S6" shown in FIG. 10.

A circuit connected to the load instrument 900 on this occasion makes the circuit shown in FIG. 14. That is, the switch SW6 turns "ON," and the switches other than the switches (SW5, SW6) turn "OFF." Based on the applied voltage "V" and output voltage "V3," the control apparatus 1000 carries out an ON/OFF PWM control for turning on and off the switch SW5. That is, the control apparatus 1000 can make the applied voltage "V" a desired voltage by making the proportion of "ON" duty less when the output voltage "V3" is high, or by making the proportion of "ON" duty more when the output voltage "V3" is low.

When the output voltage "V3" of the third power-generation circuital unit 430 is greater than the other output voltages ("V1," "V2"), and when the output voltage "V3" is great sufficiently, only the third power-generation circuital unit 430 is used in order to output voltages with respect to the load instrument 900. Therefore, a desired voltage can be output with respect to the load instrument 900 for a long period of time, while the first and second power-generation circuital units (410, 420), which are shut off from the load instrument 900, store electricity efficiently.

When the conditions at "S1" in FIG. 10 are not satisfied (i.e., "N" at "S1"), the control apparatus 1000 judges whether or not any of the following conditions is satisfied: ("V1"+"V2")>"Vth"; ("V2"+"V3")>"Vth"; and ("V3"+"V1")>"Vth" (at "S11" in FIG. 11). When the condition is satisfied (i.e., "Y" at "S11"), the control apparatus 1000 judges whether or not the following are satisfied: ("V1"+"V2")>("V2"+"V3"); and ("V1"+"V2")>("V3"+"V1") (at "S12" in FIG. 11). When this condition is satisfied (i.e., "Y" at "S12"), the control apparatus 1000 controls the switch SW to connect the first power-generation circuital unit 410 and second power-generation circuital unit 420 to the load instrument 900 while connecting them in series, and so as to shut off the third power-generation circuital unit 430 from the load instrument 900 (at "S13" in FIG. 11).

Figure 15:
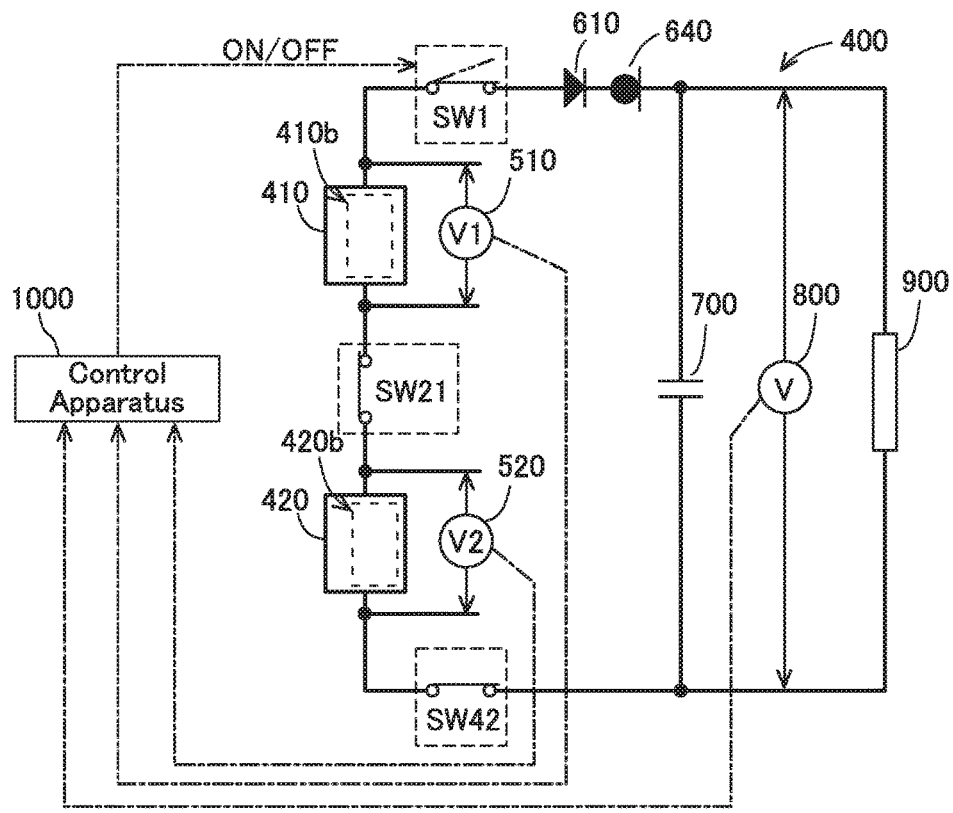
FIG. 15 is a circuit diagram at step "S13" shown in FIG. 11.

A circuit connected to the load instrument 900 on this occasion makes the circuit shown in FIG. 15. That is, the switches (SW21, SW42) turn "ON," and the switches other than the switches (SW1, SW21, SW42) turn "OFF." Based on the applied voltage "V" and output voltages ("V1," "V2"), the control apparatus 1000 carries out an ON/OFF PWM control for turning on and off the switch SW1. That is, the control apparatus 1000 can make the applied voltage "V" a desired voltage by making the proportion of "ON" duty less when a sum of the output voltages ("V1"+"V2") is high, or by making the proportion of "ON" duty more when a sum of the output voltages ("V1"+"V2") is low.

That is, when a desired applied voltage "V" cannot be output by one of the first, second and third power-generation circuital units (410, 420, 430) alone, any two of the first, second and third power-generation circuital units (410, 420, 430) are connected to the load instrument 900. In FIG. 15, the first and second power-generation circuital units (410, 420) are connected to the load instrument 900.

When a sum of the output voltages ("V1"+"V2") of the first and second power-generation circuital units (410, 420) is greater than a sum of the other two output voltages ("V2"+"V3") and ("V3"+"V1"), and when the sum of the output voltages ("V1"+"V2") is great sufficiently, the first and second power-generation circuital units (410, 420) are used in order to output voltages with respect to the load instrument 900. The first and second power-generation circuital units (410, 420) are connected in series. Therefore, a desired voltage can be output with respect to the load instrument 900 for a long period of time, while the third power-generation circuital unit 430, which is shut off from the load instrument 900, stores electricity efficiently.

Figure 11:
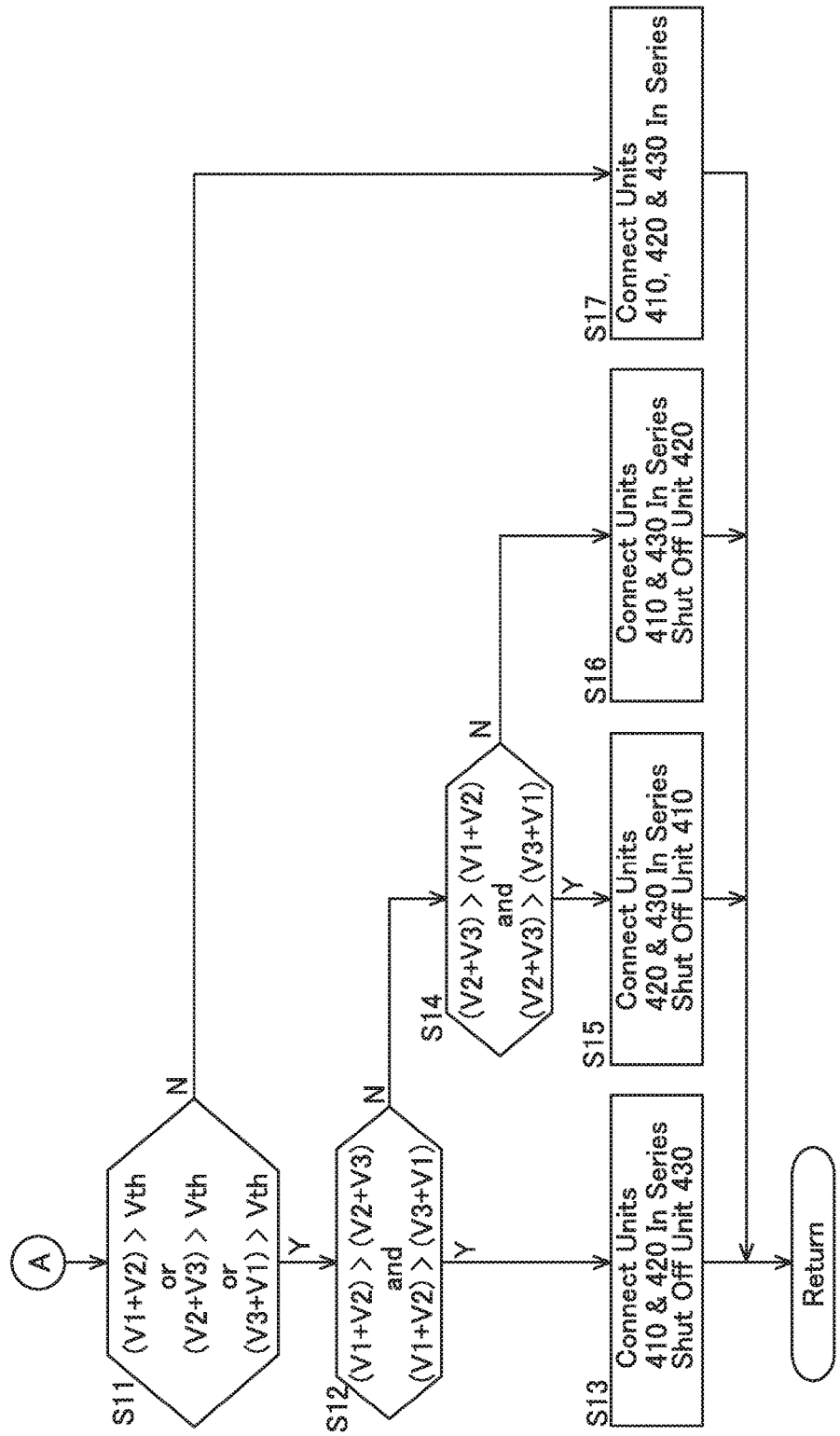
FIG. 11 is another flow chart illustrating other processes of the control apparatus which is shown in FIG. 9.

When the conditions at "S12" in FIG. 11 are not satisfied (i.e., "N" at "S12"), the control apparatus 1000 judges whether or not the following are satisfied: ("V2"+"V3")>("V1"+"V2"); and ("V2"+"V3")>("V3"+"V1") (at "S14" in FIG. 11). When this condition is satisfied (i.e., "Y" at "S14"), the control apparatus 1000 controls the switch SW to connect the second power-generation circuital unit 420 and third power-generation circuital unit 430 to the load instrument 900 while connecting them in series, and so as to shut off the first power-generation circuital unit 410 from the load instrument 900 (at "S15" in FIG. 11).

Figure 16:
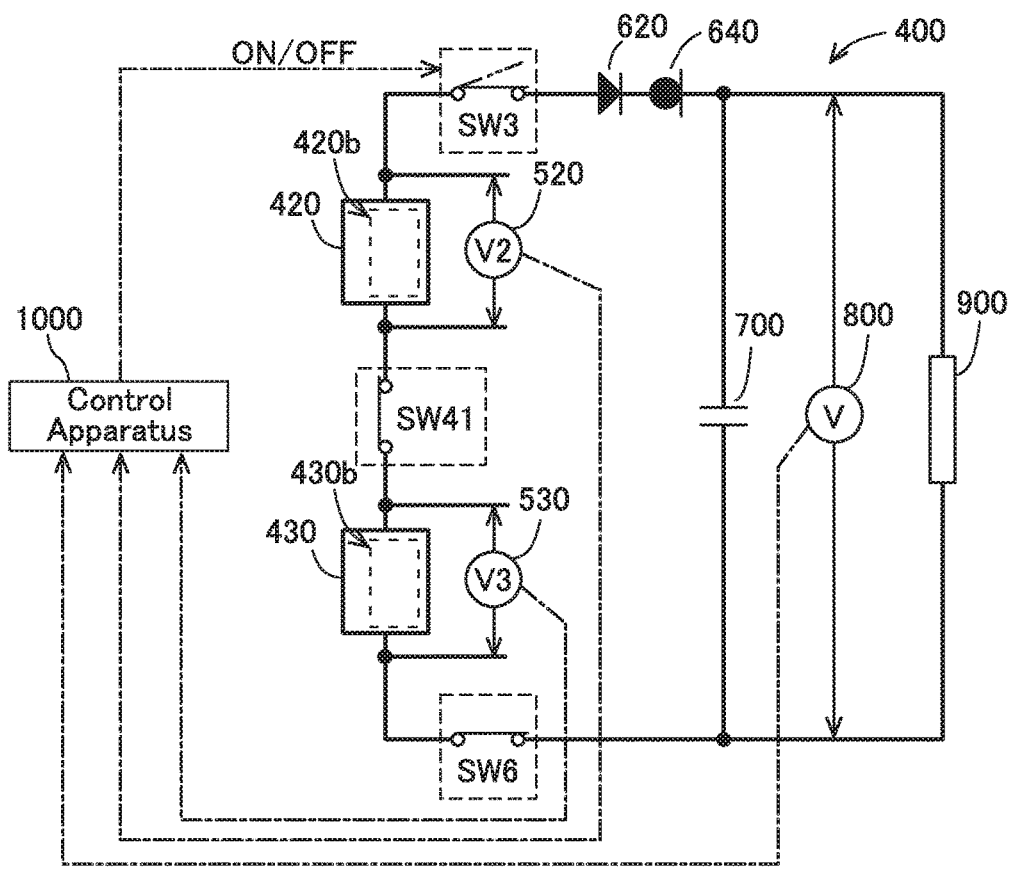
FIG. 16 is a circuit diagram at step "S15" shown in FIG. 11.

A circuit connected to the load instrument 900 on this occasion makes the circuit shown in FIG. 16. That is, the switches (SW41, SW6) turn "ON," and the switches other than the switches (SW3, SW41, SW6) turn "OFF." Based on the applied voltage "V" and output voltages ("V2," "V3"), the control apparatus 1000 carries out an ON/OFF PWM control for turning on and off the switch SW3. That is, the control apparatus 1000 can make the applied voltage "V" a desired voltage by making the proportion of "ON" duty less when a sum of the output voltages ("V2"+"V3") is high, or by making the proportion of "ON" duty more when a sum of the output voltages ("V2"+"V3") is low.

When a sum of the output voltages ("V2"+"V3") of the second and third power-generation circuital units (420, 430) is greater than a sum of the other two output voltages ("V1"+"V2") and ("V3"+"V1"), and when the sum of the output voltages ("V2"+"V3") is great sufficiently, the second and third power-generation circuital units (420, 430) are used in order to output voltages with respect to the load instrument 900. The second and third power-generation circuital units (420, 430) are connected in series. Therefore, a desired voltage can be output with respect to the load instrument 900 for a long period of time, while the first power-generation circuital unit 410, which is shut off from the load instrument 900, stores electricity efficiently.

When the conditions at "S14" in FIG. 11 are not satisfied (i.e., "N" at "S14"), the control apparatus 1000 controls the switch SW to connect the first power-generation circuital unit 410 and third power-generation circuital unit 430 to the load instrument 900 while connecting them in series, and so as to shut off the second power-generation circuital unit 420 from the load instrument 900 (at "S16" in FIG. 11). At "S14" in FIG. 11, the case where the following are not satisfied: ("V2"+"V3")>("V1"+"V2"); and ("V2"+"V3")>("V3"+"V1") is equal to the other case where the following are satisfied: ("V3"+"V1")>("V1"+"V2"); and ("V3"+"V1")>("V2"+"V3").

Figure 17:
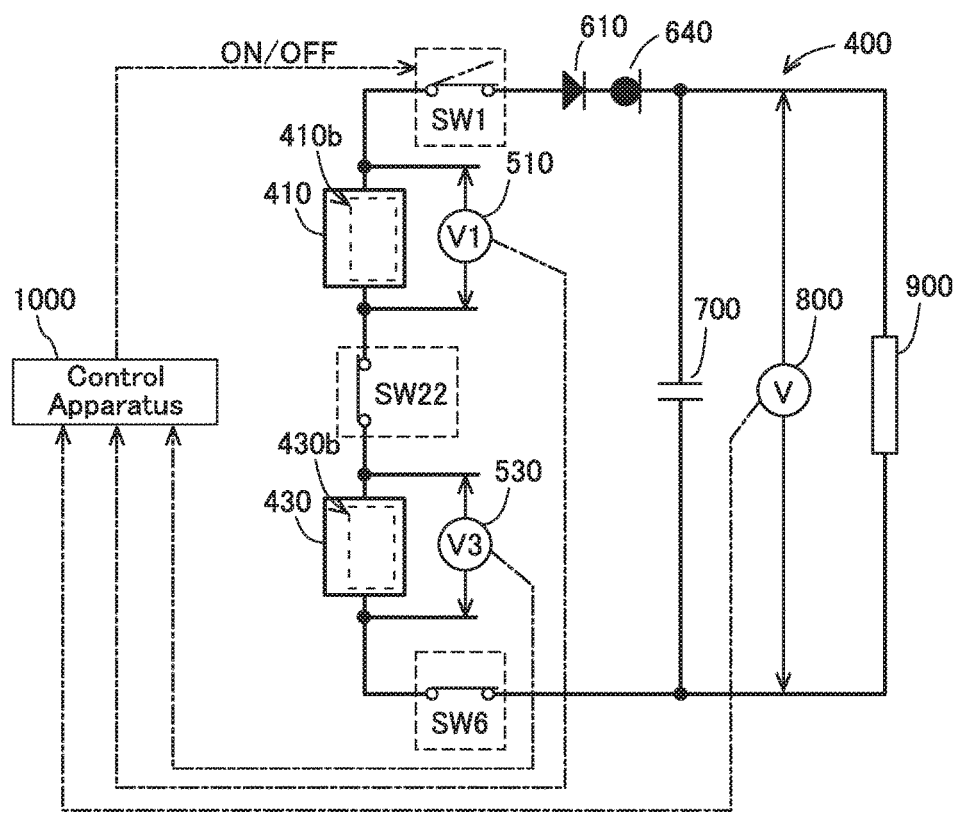
FIG. 17 is a circuit diagram at step "S16" shown in FIG. 11.
Figure 18:
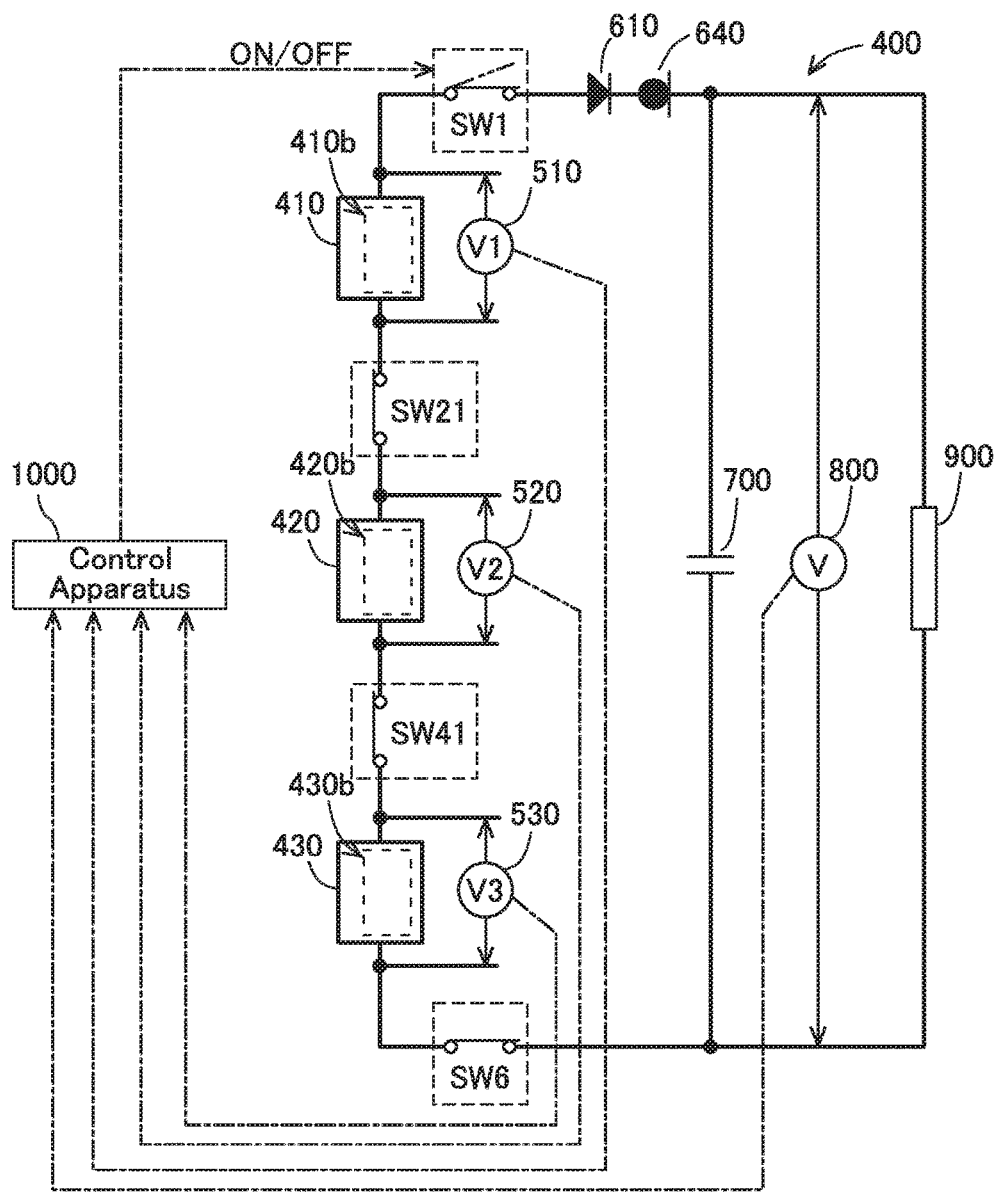
FIG. 18 is a circuit diagram at step "S17" shown in FIG. 11.

A circuit connected to the load instrument 900 on this occasion makes the circuit shown in FIG. 17. That is, the switches (SW22, SW6) turn "ON," and the switches other than the switches (SW1, SW22, SW6) turn "OFF." Based on the applied voltage "V" and output voltages ("V1," "V3"), the control apparatus 1000 carries out an ON/OFF PWM control for turning on and off the switch SW1. That is, the control apparatus 1000 can make the applied voltage "V" a desired voltage by making the proportion of "ON" duty less when a sum of the output voltages ("V3"+"V1") is high, or by making the proportion of "ON" duty more when a sum of the output voltages ("V3"+"V1") is low.

When a sum of the output voltages ("V3"+"V1") of the first and third power-generation circuital unit s (410, 430) is greater than a sum of the other two output voltages ("V1"+"V2") and (("V2"+"V3"), and when the sum of the output voltages ("V3"+"V1") is great sufficiently, the first and third power-generation circuital units (410, 430) are used in order to output voltages with respect to the load instrument 900. The first and third power-generation circuital units (410, 430) are connected in series. Therefore, a desired voltage can be output with respect to the load instrument 900 for a long period of time, while the second power-generation circuital unit 420, which is shut off from the load instrument 900, stores electricity efficiently.

When the conditions at "S11" in FIG. 11 are not satisfied (i.e., "N" at "S11"), all of the power-generation circuital units (410, 420, 430) are connected in series, and are then connected to the load instrument 900 (at "S17" in FIG. 11). A circuit connected to the load instrument 900 on this occasion makes the circuit shown in FIG. 18. That is, the switches (SW21, SW 41, SW6) turn "ON," and the switches other than the switches (SW1, SW21, SW41, SW6) turn "OFF." Based on the applied voltage "V" and output voltages ("V1," "V2," "V3"), the control apparatus 1000 carries out an ON/OFF PWM control for turning on and off the switch SW1. That is, the control apparatus 1000 can make the applied voltage "V" a desired voltage by making the proportion of "ON" duty less when a sum of the output voltages ("V1"+"V2"+"V3") is high, or by making the proportion of "ON" duty more when a sum of the output voltages ("V1"+"V2"+"V3") is low.

That is, connections are made as aforementioned when a desired voltage "V" cannot be output even by one of the first, second and third power-generation circuital units (410, 420, 430) alone, as well as even by using any two of the first, second and third power-generation circuital units (410, 420, 430). Since all of the power-generation circuital units (410, 420, 430) are connected in series, a voltage, which is the highest at present, is output.

Advantages of Fifth Embodiment

The control apparatus 1000 switches between a state of connecting any one of the first, second and third power-generation circuital units (410, 420, 430) to the load instrument 900 (i.e., a first state), another state of connecting any two of them to it (i.e., a second state), and still another state of connecting all of them to it (i.e., a third state). Based on the applied voltage "V" and each of the output voltages ("V1," "V2," "V3"), the control apparatus 1000 carries out the aforementioned switching. And, one or two of the power-generation circuital units, which are not connected to the load instrument 900, concentrate on storing electricity. Therefore, the power generation system 400 can output a desired voltage with respect to the load instrument 900 for a long period of time by switching between the connection and shutoff to and from the load instrument 900, depending on the output voltages ("V1," "V2," "V3").

In addition, a desired voltage can be output to the load instrument 900 by connecting the rectifier circuits (410b, 420b, 430b), whose output voltages ("V1," "V2," "V3") are great, to the load instrument 900. On the other hand, the rectifier circuits (410b, 420b, 430b) can store electricity securely by shutting off the rectifier circuits (410b, 420b, 430b), whose output voltages ("V1," "V2," "V3") are small, from the load instrument 900. As a result, the power generation system 400 can output a desired voltage with respect to the load instrument 900 for a long period of time.

Based on the output voltages ("V1," "V2," "V3"), the control apparatus 1000 determines a number of the power-generation circuital units (410, 420, 430) to be connected to the load instrument 900 in the manner as set forth in the first state, second state and third state. In view of this, the power generation system 400 can output a desired voltage with respect to the load instrument 900 for a long period of time.

Sixth Embodiment

Based on the applied voltage "V" and output voltages ("V1," "V2," "V3"), the control apparatus 1000 of the power generation system 400 according to Sixth Embodiment controls the switch SW. In addition to this, based on ON duties in the switches (SW1, SW3, SW5), namely, objects under the PWM control, the control apparatus 1000 can al so determine whether the rectifier circuits (410b, 420b, 430b) are kept to be connected to the load instrument 900, or whether the rectifier circuits (410b, 420b, 430b) are shut off from the load instrument 900.

When output voltages of the connected rectifier circuits do not reach a desired voltage for the load instrument 900, it makes a state where the applied voltage "V" does not reach the desired voltage, although the proportion of ON duties in the switches, which correspond to the rectifier circuits, is 100%. Hence, the following are judged, for instance: whether the proportion of ON duties in the switches (e.g., any of SW1, SW3 and SW5) exceeds a predetermined threshold value; and whether the applied voltage "V" does not reach the desired voltage. Then, when the conditions are satisfied, it is judged to be likely to be unable to continue an application of the desired voltage with respect to the load instrument 900.

If such is the case, the rectifier circuits, which have been connected, are not kept to be connected to the load instrument 200 independently, but the rectifier circuits (410b, 420b, 430b) to be connected to the load instrument 900 are changed over one after another. For example, when the aforementioned conditions are satisfied, the rectifier circuits (410b, 420b, 430b) to be connected to the load instrument 900 anew are judged, and then the rectifier circuits (410b, 420b, 430b) to be connected to the load instrument 900 are changed over one after another. The power generation system 400 on this occasion effects the same advantages as those of Fifth Embodiment.

Seventh Embodiment

In Seventh Embodiment, the alternating voltages, which each of the power generation apparatuses (410a, 420a, 430a) outputs, are set to have different phases by making the vibration directions of the vibrating bodies (12, 22, 32) different. In addition to this, the first, second and third vibrating bodies (12, 22, 32) are set so as to have different lengths, as shown in FIG. 6. That is, the first, second and third vibrating bodies (12, 22, 32) have different resonance frequencies; as a result, alternating voltages, which the first, second third power-generating bodies (13, 23, 33) installed respectively to the first, second and third vibrating bodies (12, 22, 32) output, have different phases. Also in this instance, it becomes feasible to store electricity securely in each of the capacitors (413, 414, 423, 424, 433, 434) in the same manner as aforementioned. Note that, in order to make the resonance frequencies of the first, second and third vibrating bodies (12, 22, 32) different, it is also allowable to make the first, second and third (12, 22, 32) have different masses.

Eighth Embodiment

As illustrated in FIG. 8, it is also allowable that the power generation system 400 in the present embodiment can comprise a vibrating body 351 supported vibratably, and formed as a tubular shape. In an outer peripheral face of the vibrating body 351, first through sixth power-generating bodies (352 through 357) constructing first through sixth power generation apparatuses are disposed at positions with different phases respectively. The first through sixth power generating bodies (352 through 357) output alternating voltages by vibrations in directions corresponding to the phases of the vibrating body 351 to which they are installed. In this instance, the first through sixth power generating apparatuses are set to be able to be connected in series. That is, the first, second and third power generating bodies (352, 353, 354) output alternating voltages with different phases. Moreover, the fourth, fifth and sixth power generating bodies (355, 356, 357) output alternating voltages with different phases. Also in this instance, it becomes feasible to store electricity securely in each of the capacitors (413, 414, 423, 424, 433, 434). Note that, in the present embodiment, although the first through sixth power-generating bodies (352 through 357) are set to be disposed on an outer peripheral face of the vibrating body 351, it is also allowable to dispose them on an inner peripheral surface of the vibrating body 351.

Modified Modes of Fifth Embodiment

In Fifth Embodiment, the rectifier circuits in the first, second and third power-generation circuital units (410, 420, 430) are set to be the voltage-doubling rectifier circuits (410b, 420b, 430b). In addition to this, it is possible to apply a full-wave rectifier circuit, for instance, to the rectifier circuits, respectively. Moreover, in the aforementioned embodiments, although the power generation system 400 are set to comprise the three power-generation circuital units (410, 420, 430), it is also allowable that it can be set to comprise the two power-generation circuital units (410, 420).

Moreover, the power generation system 400 in Fifth Embodiment is set to comprise the constant-current circuit 640. However, depending on how the switches (SW1, SW21 through SW23, SW3, SW41 through SW42, SW5, SW6) are changed over one after another, it is also allowable that the power generation system 400 can be set to have a construction which does not comprise the constant-current circuit 640 at all.

What is claimed is:

1. A power generation system outputting generated electric powers to a load instrument, the power generation system comprising:
    a first power generation apparatus and a second power generation apparatus outputting alternating voltages by an input of vibrations;
    a first voltage-doubling rectifier circuit not only rectifying the alternating voltages output by the first power generation apparatus to store electricity, but also outputting enhanced voltages to the load instrument;
    a second voltage-doubling rectifier circuit connected in series to the first voltage-doubling rectifier circuit, and not only rectifying the alternating voltages output by the second power generation apparatus to store electricity, but also outputting enhanced voltages to the load instrument;
    a constant-current circuit connected in series to the load instrument, thereby limiting currents flowing from the first voltage-doubling rectifier circuit and the second voltage-doubling rectifier circuit to the load instrument to a predetermined current or less.

2. The power generation system according to claim 1, wherein the alternating voltages, which the first power generation apparatus outputs, and the alternating voltages, which the second power generation apparatus outputs, are alternating voltages with different phases.

3. The power generation system according to claim 1, the power generation system comprising:
    a first in-line unit including the first power generation apparatus, the second power generation apparatus, the first voltage-doubling rectifier circuit, and the second voltage-doubling rectifier circuit;
    a second in-line unit being a second in-line unit including another one of the first power generation apparatus, another one of the second power generation apparatus, another one of the first voltage-doubling rectifier circuit, and another one of the second voltage-doubling rectifier circuit, the second in-line unit connected in parallel with respect to the first in-line unit;
    wherein the constant-current circuit limits currents flowing from the first in-line unit and the second in-line unit to the load instrument to a predetermined current or less.

4. The power generation system according to claim 1, the power generation system comprising first and second vibrating bodies having different vibration directions, wherein:
    one of the first power generation apparatus and the second power generation apparatus is disposed in the first vibrating body, thereby outputting alternating voltages by vibrations of the first vibrating body;
another one of the first power generation apparatus and the second power generation apparatus is disposed in the second vibrating body, thereby outputting alternating voltages by vibrations of the second vibrating body.

5. The power generation system according to claim 1, the power generation system further comprising:
a third power generation apparatus outputting alternating voltages by an input of vibrations;
a third rectifier circuit rectifying the alternating voltages output by the third power generation apparatus, and connected in series to the first voltage-doubling rectifier circuit and the second voltage-doubling rectifier circuit;
the power generation system furthermore comprising first, second and third vibrating bodies having different vibration directions, wherein:
one of the first power generation apparatus, the second power generation apparatus and the third power generation apparatus is disposed in the first vibrating body, thereby outputting alternating voltages by vibrations of the first generating body;
one of other two of the first power generation apparatus, the second power generation apparatus and the third power generation apparatus is disposed in the second vibrating body, thereby outputting alternating voltages by vibrations of the second vibrating body;
remaining one of the first power generation apparatus, the second power generation apparatus and the third power generation apparatus is disposed in the third vibrating body, thereby outputting alternating voltages by vibrations of the third vibrating body.

6. The power generation system according to claim 1, the power generation system further comprising:
first and second vibrating bodies supported vibratably, and having different resonance frequencies;
one of the first power generation apparatus and the second power generation apparatus is disposed in the first vibrating body, thereby outputting alternating voltages by vibrations of the first vibrating body;
another one of the first power generation apparatus and the second power generation apparatus is disposed in the second vibrating body, thereby outputting alternating voltages by vibrations of the second vibrating body.

7. The power generation system according to claim 1, the power generation system further comprising:
a vibrating body supported vibratably, and formed as a tubular shape;
one of the first power generation apparatus and the second power generation apparatus is disposed at a first-phase position in an outer peripheral face or inner peripheral face of the vibrating body, thereby outputting alternating voltages by vibrations of the vibrating body;
another one of the first power generation apparatus and the second power generation apparatus is disposed at a second-phase position, which differs from the first-phase position, in the outer peripheral phase or inner peripheral phase of the vibrating body, thereby outputting alternating voltages by vibrations of the vibrating body.

8. The power generation system according to claim 1, the power generation system further comprising:
at least two power generation apparatuses including the first power generation apparatus and the second power generation apparatus;
at least two rectifier circuits including the first voltage-doubling rectifier circuit and the second voltage-doubling rectifier circuit;
a switch switching between a state of connecting each of the at-least-two rectifier circuits with the load instrument and a state of shutting off each of the at-least-two rectifier circuits from the load instrument;
an applied-voltage detector detecting voltages to be applied to the load instrument;
a control apparatus not only determining at least one of the rectifier circuits to be connected to the load instrument but also determining at least another of the rectifier circuits to be shut off from the load instrument, based on an applied voltage detected by the applied-voltage detector, thereby controlling the switch so as to make the determined states.

9. The power generation system according to claim 8, the power generation system further comprising:
an output-voltage detector detecting each of output voltages of the at-least-two rectifier circuits, wherein:
the control apparatus determines the rectifier circuit to be connected to the load instrument, and determines the rectifier circuit to be shut off from the load instrument apparatus, based on the applied voltage and each of the output voltages.

10. The power generation system according to claim 9, wherein the control apparatus:
determines the rectifier circuit, whose rectifier-circuit output voltages are greater, as the rectifier circuit to be connected to the load instrument;
determines the rectifier circuit, whose rectifier-circuit output voltages are smaller, as the rectifier circuit to be shut off from the load instrument.

11. The power generation system according to claim 8, wherein the control apparatus:
adjusts a voltage to be applied to the load instrument by subjecting the switch, which connects the load instrument with the rectifier circuit, to an ON/OFF PWM control, based on the applied voltage;
further determines whether keeping the rectifier circuit connected to the load instrument or shutting the rectifier circuit off from the load instrument, based on the applied voltage and ON duty in the PWM control.

12. The power generation system according to claim 8, the power generation system further comprising a smoothing circuit connected in parallel to the load instrument, thereby being subjected to electricity storage by each of the at-least-two rectifier circuits, wherein:
the applied-voltage detector detects voltages at opposite ends of the smoothing circuit.

13. The power generation system according to claim 8, the power generation system further comprising:
at least three power generation apparatuses outputting alternating voltages by an input of vibrations;
at least three rectifier circuits rectifying the alternating voltages, which are output by each of the at-least-three power generation apparatuses, to store electricity, and outputting stored voltages respectively to the load instrument;
the power generation system defining:
a state, not only in which only one rectifier circuit of the at-least-three rectifier circuits is connected to the load instrument but also in which the other rectifier circuits are shut off from the load instrument, as a first state;
a state, not only in which, while connecting at least two of the rectifier circuits of the at-least-three rectifier circuits in series to one another, the at-least-two rectifier circuits connected in series to one another are connected with the load instrument but also in which the other rectifier circuit is shut off from the load instrument, as a second state, wherein:

the switch is capable of switching between the first state and the second state;

the control apparatus determines any of the first state and the second state based on the applied voltage detected by the applied-voltage detector, thereby controlling the switch so as to make the determined states.

14. The power generation system according to claim 13, the power generation system further comprising at-least-three output-voltage detectors detecting each of output voltages of the at-least-three rectifier circuits, wherein:

the control apparatus:

determines, when any one of the respective output voltages is greater than a threshold value, to be in the first state in which one of the rectifier circuits corresponding to the output voltage is connected with the load instrument;

determines to be in the second state when all of the respective output voltages are the threshold value or less.

15. The power generation system according to claim 1, wherein:

not only the first voltage-doubling rectifier circuit includes a first capacitor for first voltage doubling for storing the alternating voltages rectified, but also the second voltage-doubling rectifier circuit includes a second capacitor for second voltage doubling for storing the alternating voltages rectified;

a circuit made up of the first voltage-doubling rectifier circuit, the second capacitor of the second voltage-doubling rectifier circuit and the load instrument discharges charges on the second capacitor when the first power generation apparatus stores the alternating voltages in the first capacitor of the first voltage-doubling rectifier circuit;

another circuit made up of the first capacitor of the first voltage-doubling rectifier circuit, the second voltage-doubling rectifier circuit and the load instrument discharges charges on the first capacitor when the second power generation apparatus stores the alternating voltages in the second capacitor of the second voltage-doubling rectifier circuit.

16. A power generation system outputting generated electric powers to a load instrument, the power generation system comprising:

at least two power generation apparatuses including a first power generation apparatus and a second power generation apparatus outputting alternating voltages by an input of vibrations;

at least two rectifier circuits including a first voltage-doubling rectifier circuit and a second rectifier circuit, the first voltage-doubling rectifier circuit not only rectifying the alternating voltages output by the first power generation apparatus to store electricity but also outputting enhanced voltages to the load instrument, the second rectifier circuit rectifying the alternating voltages output by the second power generation apparatus, and connected in series to the first voltage-doubling rectifier circuit, thereby outputting rectified voltages to the load instrument;

a constant-current circuit connected in series to the load instrument, thereby limiting currents flowing to the load instrument to a predetermined current or less;

a switch switching between a state of connecting each of the at-least-two rectifier circuits with the load instrument and a state of shutting off each of the at-least-two rectifier circuits from the load instrument;

an applied-voltage detector detecting voltages to be applied to the load instrument;

a control apparatus not only determining at least one of the rectifier circuits to be connected to the load instrument but also determining at least another of the rectifier circuits to be shut off from the load instrument, based on an applied voltage detected by the applied-voltage detector, thereby controlling the switch so as to make the determined states.

\* \* \* \* \*

UNITED STATES PATENT AND TRADEMARK OFFICE
CERTIFICATE OF CORRECTION

| | | |
|---|---|---|
| PATENT NO. | : 10,361,355 B2 | Page 1 of 1 |
| APPLICATION NO. | : 15/130010 | |
| DATED | : July 23, 2019 | |
| INVENTOR(S) | : Hajime Kurikuma et al. | |

It is certified that error appears in the above-identified patent and that said Letters Patent is hereby corrected as shown below:

On the Title Page

Item (73), please change "SUMITOMO RIKO COMPANY LIMITED" to -- Sumitomo Riko Company Limited --.

Signed and Sealed this
Fourteenth Day of April, 2020

Andrei Iancu
*Director of the United States Patent and Trademark Office*